(12) United States Patent
Jia et al.

(10) Patent No.: US 10,332,691 B2
(45) Date of Patent: Jun. 25, 2019

(54) METHOD FOR MANUFACTURING HEMT/HHMT DEVICE BASED ON $CH_3NH_3PBI_3$ MATERIAL

(71) Applicant: Xidian University, Xi'an (CN)

(72) Inventors: Renxu Jia, Xi'an (TW); Lei Yuan, Xi'an (CN); Yucheng Wang, Xi'an (CN); Tiqiang Pang, Xi'an (CN); Yuming Zhang, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 0 days.

(21) Appl. No.: 16/120,244

(22) Filed: Sep. 1, 2018

(65) Prior Publication Data

US 2018/0374654 A1    Dec. 27, 2018

Related U.S. Application Data

(63) Continuation of application No. PCT/CN2017/114674, filed on Dec. 5, 2017.

(30) Foreign Application Priority Data

Dec. 8, 2016   (CN) .......................... 2016 1 1122943
Dec. 8, 2016   (CN) .......................... 2016 1 1123708
Dec. 8, 2016   (CN) .......................... 2016 1 1124458
Feb. 10, 2017  (CN) .......................... 2017 1 0074139

(51) Int. Cl.
*H01L 21/00*   (2006.01)
*H01G 9/20*    (2006.01)
(Continued)

(52) U.S. Cl.
CPC .......... *H01G 9/2072* (2013.01); *H01G 9/0036* (2013.01); *H01G 9/2009* (2013.01); *H01G 9/2018* (2013.01); *H01L 27/302* (2013.01); *H01L 51/0003* (2013.01); *H01L 51/005* (2013.01); *H01L 51/0021* (2013.01); *H01L 51/0026* (2013.01); *H01L 51/428* (2013.01);
(Continued)

(58) Field of Classification Search
CPC ......... H01L 29/66431; H01L 29/66462; H01L 29/778–7789
See application file for complete search history.

(56) References Cited

U.S. PATENT DOCUMENTS

2003/0017683 A1*  1/2003  Emrick .............. H01L 29/66318
                                                              438/478
2006/0237711 A1* 10/2006  Teraguchi ........... H01L 29/1029
                                                                257/14

* cited by examiner

*Primary Examiner* — Richard A Booth
(74) *Attorney, Agent, or Firm* — WPAT, PC

(57) ABSTRACT

A method for manufacturing a HEMT/HHMT device based on $CH_3NH_3PbI_3$ material are provided. The method includes: selecting an $Al_2O_3$ substrate; manufacturing a source electrode and a drain electrode; forming a first electron transport layer on a surface of the source electrode, a surface of the drain electrode, and a surface of the $Al_2O_3$ substrate not covered by the source electrode and the drain electrode; manufacturing $CH_3NH_3PbI_3$ material on a surface of the first electron transport layer to form a first light absorbing layer; and forming a gate electrode on a surface of the first light absorbing layer to complete the manufacture of the HEMT device.

16 Claims, 19 Drawing Sheets

(51) Int. Cl.
*H01L 51/00* (2006.01)
*H01L 27/30* (2006.01)
*H01L 51/44* (2006.01)
*H01L 51/42* (2006.01)
*H01G 9/00* (2006.01)
C23C 14/18 (2006.01)
C23C 14/04 (2006.01)
H01L 51/05 (2006.01)

(52) U.S. Cl.
CPC ........ H01L 51/4226 (2013.01); H01L 51/441 (2013.01); C23C 14/042 (2013.01); C23C 14/18 (2013.01); H01L 51/006 (2013.01); H01L 51/0047 (2013.01); H01L 51/0056 (2013.01); H01L 51/0077 (2013.01); H01L 51/0541 (2013.01); H01L 2251/303 (2013.01); Y02E 10/549 (2013.01)

METHOD FOR MANUFACTURING HEMT/HHMT DEVICE BASED ON $CH_3NH_3PbI_3$ MATERIAL

FIELD OF THE DISCLOSURE

The disclosure relates to an integrated circuit technical field, and more particularly to a method for manufacturing a HEMT/HHMT device based on $CH_3NH_3PbI_3$ material.

BACKGROUND

With the rapid development of electronic technology, semiconductor integrated circuits have played an increasingly important role in social development and the national economy. Among them, the demand for optoelectronic high-speed devices is increasing day by day, and higher and more detailed requirements are constantly put forward for the performance of the devices. In order to seek a breakthrough, research on processes, materials and structures has not been interrupted. In recent years, with the rise of visible light wireless communication technology and circuit coupling technology, the market places new demands on optoelectronic high electron mobility transistors (HEMT) and optoelectronic high hole mobility transistors (HHET) in the visible light range.

The emergence of organic/inorganic perovskite ($CH_3NH_3PbI_3$) has brought a new perspective to research. The ordered combination of organic groups and inorganic groups in organic/inorganic perovskites gives a long-range ordered crystal structure and makes the organic/inorganic perovskites to combine the advantages of organic and inorganic materials. The high mobility of the inorganic component imparts good electrical properties to the hybrid perovskite; the self-assembly and film-forming properties of the organic component make the preparation process of the hybrid perovskite film simple and low-cost and can also be performed at room temperature. The high light absorption coefficient of the hybrid perovskite itself is also a superiority that the hybrid perovskite can be applied in photovoltaic materials.

Conventional inorganic HEMT/HHMT transistors are all electrical-to-electrical conversions and do not meet the demand for optoelectronic high electron/hole mobility transistors in the visible range. Therefore, how to use the characteristics of $CH_3NH_3PbI_3$ material to prepare photoelectric HEMT/HHMT devices becomes extremely important.

SUMMARY

Therefore, the present disclosure proposes a method for manufacturing a HEMT/HHMT device based on $CH_3NH_3PbI_3$ material, which can greatly improve the photoelectric conversion efficiency and enhance the performance of the device.

Specifically, an embodiment of the disclosure proposes a method for manufacturing a HEMT device based on $CH_3NH_3PbI_3$ material. The method includes:

Step 1, selecting an $Al_2O_3$ substrate;
Step 2, preparing a source electrode and a drain electrode on the $Al_2O_3$ substrate;
Step 3, forming a first electron transport layer on a surface of the source electrode, a surface of the drain electrode, and a surface of the $Al_2O_3$ substrate not covered by the source electrode and the drain electrode;
Step 4, applying $CH_3NH_3PbI_3$ material on a surface of the first electron transport layer to form a first light absorbing layer; and
Step 5, forming a gate electrode on a surface of the first light absorbing layer, thereby forming the HEMT device.

An embodiment of the disclosure proposes a method for manufacturing a HHMT device based on $CH_3NH_3PbI_3$ material. The method includes:

Step a, selecting an $Al_2O_3$ substrate;
Step b, preparing a source electrode and a drain electrode;
Step c, forming a first hole transport layer on a surface of the source electrode, a surface of the drain electrode, and a surface of the $Al_2O_3$ substrate not covered by the source electrode and the drain electrode;
Step d, applying $CH_3NH_3PbI_3$ material on a surface of the first hole transport layer to form a third light absorbing layer; and
Step e, forming a gate electrode on a surface of the third light absorbing layer, thereby forming the HHMT device.

The HEMT/HHMT devices of the embodiments of the disclosure have the following advantages.

1. $CH_3NH_3PbI_3$ as a light absorbing layer provides a large amount of electrons/holes to the channel, which makes the HEMT/HHMT device having high mobility, fast switching speed, enhanced light absorption and light utilization efficiency, increased photogenerated carriers, enhanced transmission characteristics, and high photoelectric conversion efficiency.

2. By transmitting electron blocking holes by a electron transport layer, more electrons can be transported, and thereby enhancing the performance of the HEMT device.

3. By using a hole transport layer to transport hole blocking electrons, more holes can be transported, and thereby enhancing the performance of the HHMT device.

4. PCBM material is added to a light absorbing layer to form a heterojunction, which can improve the quality of the light absorbing layer film by filling holes and vacancies, thereby generating larger crystal grains and less grain boundaries, and absorbing more light to produce photogenerated carriers and to enhance device performance. Alternatively, the PCBM material is added between the light absorbing layer and the electron transport layer to improve the quality of the light absorbing layer film duo to the interface defects between the passivation layers and thereby improve device performance.

The above description is merely an overview of the technical solutions of the present disclosure, so that the technical means of the present disclosure can be more clearly understood, and can be implemented according to the contents of the specification. Also, for making the above and other objects, features, and advantages of the present disclosure more apparent and understood, preferred embodiments will be described with reference to the following detailed description hereinafter.

DETAILED DESCRIPTION OF PREFERRED EMBODIMENTS

In order to further explain the technical means and efficacy of the present disclosure for achieving the intended purpose of the disclosure, the specific embodiments, methods, steps and effects of the method for manufacturing a HEMT/HHMT device based on $CH_3NH_3PbI_3$ material according to an embodiment of the present disclosure will be described in detail below with reference to the accompanying drawings and preferred embodiments.

The foregoing and other objects, features, and advantages of the disclosure will be apparent from the detailed description of preferred embodiments with reference to the accompanying drawings. The technical means and functions of the present disclosure for achieving the intended purpose can be more deeply and specifically understood by the description of the embodiments. However, the drawings are only for reference and description, and are not intended to be used for limiting the present disclosure.

Figure 1:
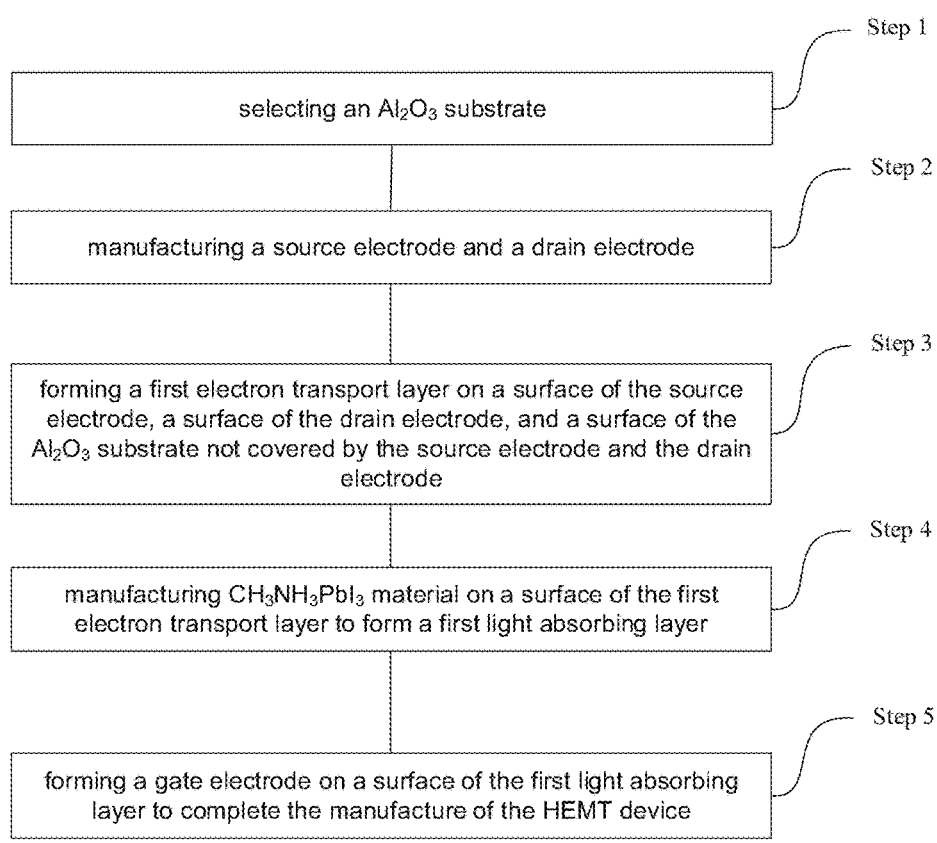
FIG. 1 is a schematic flowchart of a method for manufacturing a HEMT/HHMT device based on $CH_3NH_3PbI_3$ material according to an embodiment of the present disclosure.

Referring to FIG. 1, FIG. 1 is a schematic flowchart of a method for manufacturing a HEMT/HHMT device based on $CH_3NH_3PbI_3$ material according to an embodiment of the present disclosure. This embodiment focuses on the description of the HEMT device, and method can include the following steps.

Step 1, selecting an $Al_2O_3$ substrate;

Step 2, preparing a source electrode and a drain electrode on the $Al_2O_3$ substrate;

Step 3, forming a first electron transport layer on a surface of the source electrode, a surface of the drain electrode, and a surface of the $Al_2O_3$ substrate not covered by the source electrode and the drain electrode;

Step 4, applying $CH_3NH_3PbI_3$ material on a surface of the first electron transport layer to form a first light absorbing layer; and Step 5, forming a gate electrode on a surface of the first light absorbing layer, thereby forming the HEMT device.

In this embodiment of the disclosure, $CH_3NH_3PbI_3$ as a light absorbing layer provides a large amount of electrons/holes to the channel, which makes the HEMT/HHMT device having high mobility, fast switching speed, enhanced light absorption and light utilization efficiency, increased photogenerated carriers, enhanced transmission characteristics, and high photoelectric conversion efficiency.

The following focuses on the detailed description of two structures of the HEMT devices.

[Embodiment 1] Bidirectional HEMT Device

Figure 2:
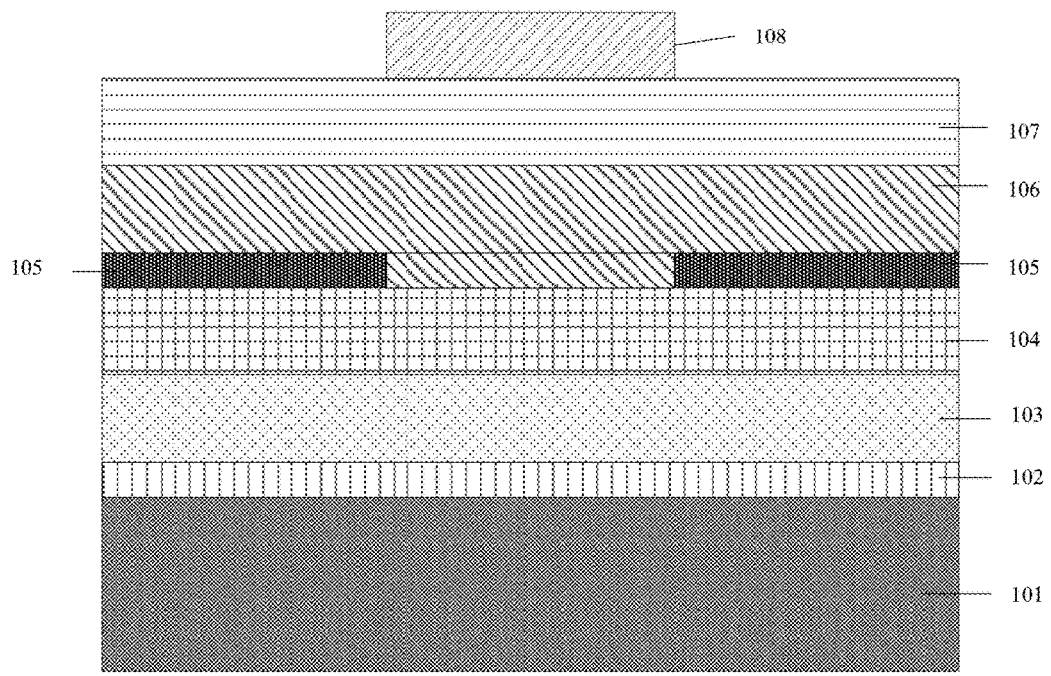
FIG. 2 is a schematic cross-sectional view of an N-type bidirectional HEMT device based on $CH_3NH_3PbI_3$ material according to an embodiment of the present disclosure.
Figure 3:
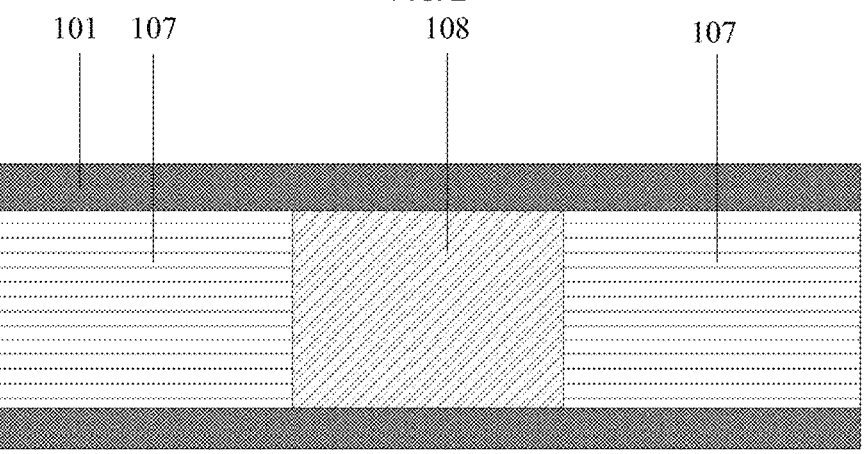
FIG. 3 is a schematic top view of an N-type bidirectional HEMT device based on $CH_3NH_3PbI_3$ material according to an embodiment of the present disclosure.

Referring to FIG. 2 and FIG. 3, FIG. 2 is a schematic cross-sectional view of an N-type bidirectional HEMT device based on $CH_3NH_3PbI_3$ material according to an embodiment of the present disclosure, and FIG. 3 is a schematic top view of an N-type bidirectional HEMT device based on $CH_3NH_3PbI_3$ material according to an embodiment of the present disclosure. Based on the above embodiments, this embodiment focuses on the introduction of a bidirectional HMET device.

Specifically, the bidirectional HEMT may include a substrate 101, a conductive glass 102, a second light absorbing layer 103, a second electron transport layer 104, a source/drain electrode 105, a first electron transport layer 106, a first light absorbing layer 107, and a gate electrode 108. Materials of the substrate 101, the conductive glass 102, the second light absorbing layer 103, the second electron transport layer 104, the source/drain electrodes 105, the first electron transport layer 106, the first light absorbing layer 107, and the gate electrode 108 are vertically distributed from bottom to top sequentially to form a multi-layer symmetrical structure, thereby forming a bidirectional high electron mobility transistor. The substrate 101 may be sapphire, the source and drain electrodes 105 may be Au material; the second electron transport layer 104 and the first electron transport layer 106 may be $TiO_2$ material; the second light absorbing layer 103 and the first light absorbing layer 107 may be $CH_3NH_3PbI_3$ material; the conductive glass 102 may be FTO material and the gate electrode 108 may be Au material.

Figure 4A:
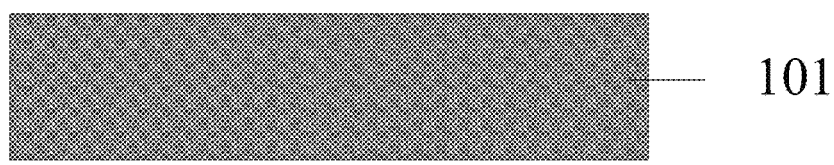
FIG. 4a-4h are schematic diagrams showing processes of a method for manufacturing an N-type bidirectional HEMT device based on $CH_3NH_3PbI_3$ material according to an embodiment of the present disclosure.
Figure 4B:
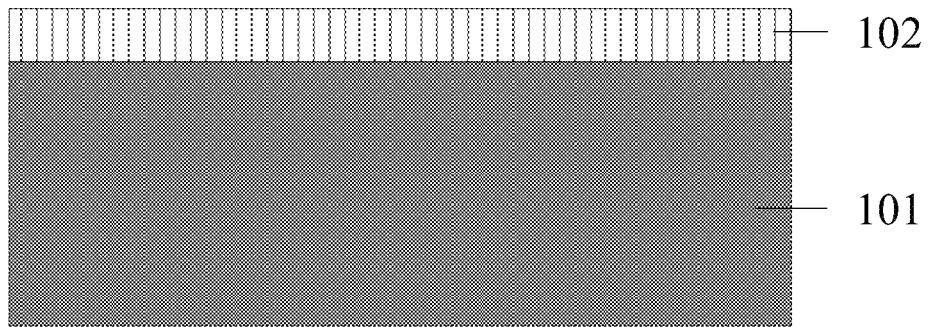
Figure 4C:
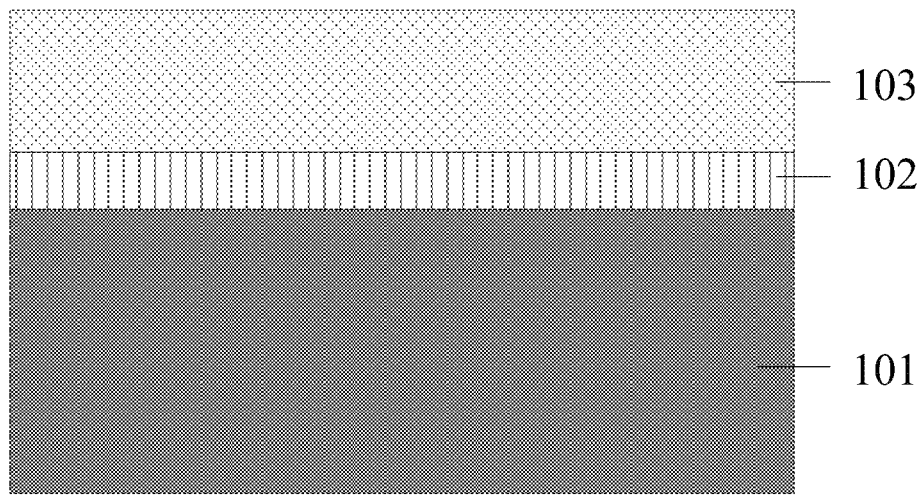
Figure 4D:
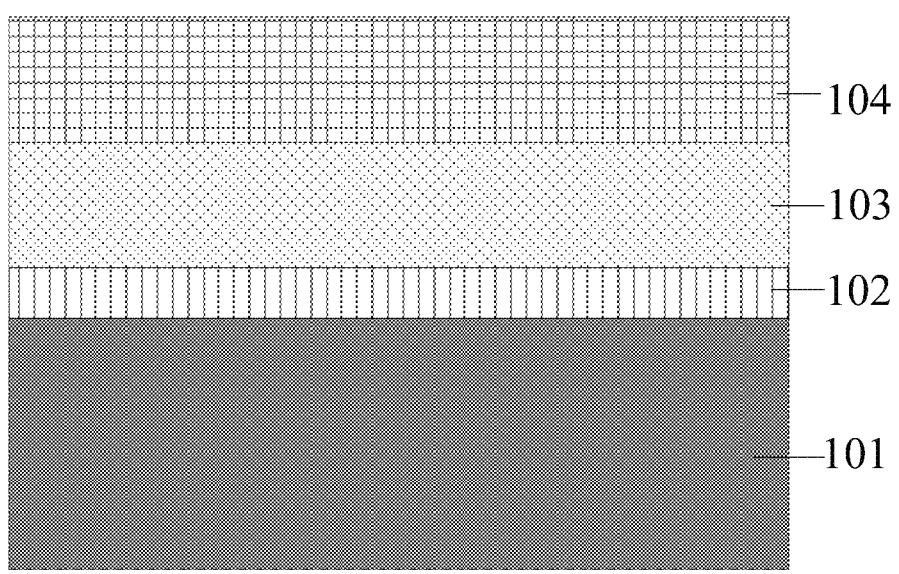
Figure 4E:
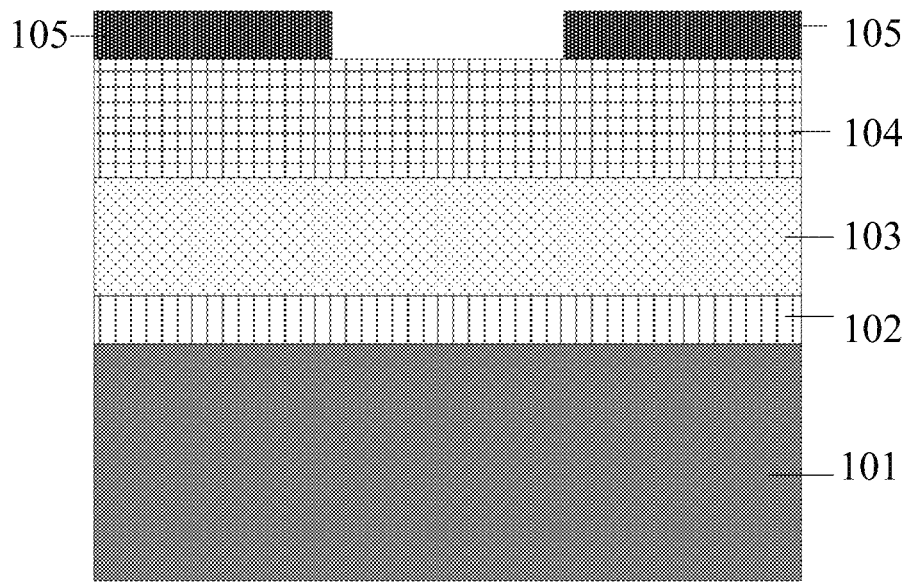
Figure 4F:
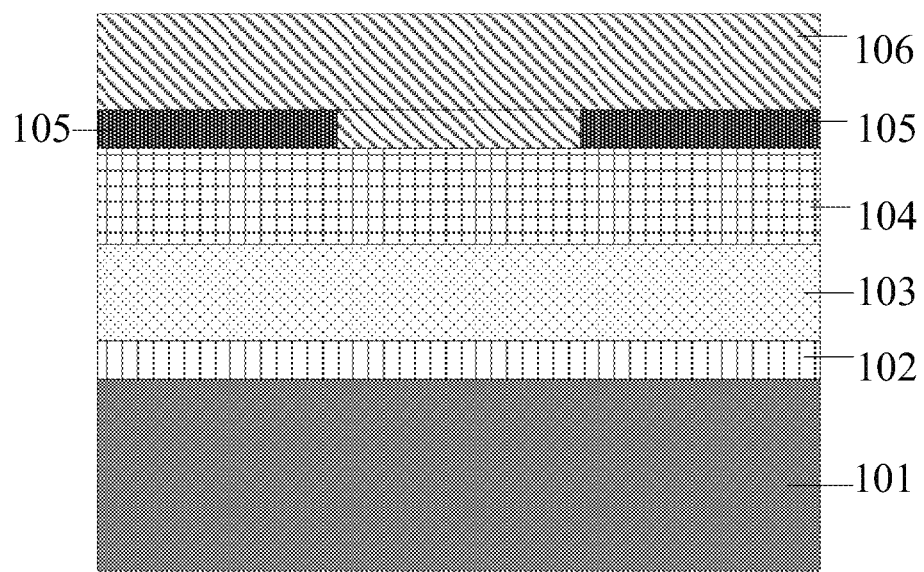
Figure 4G:
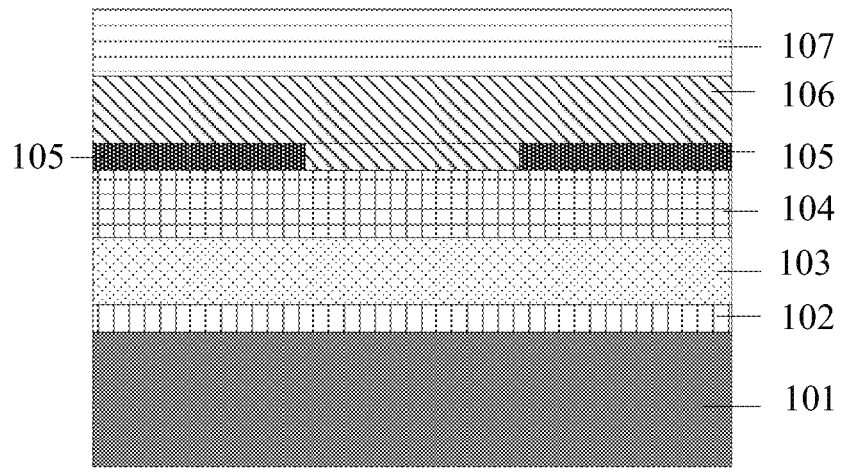
Figure 4H:
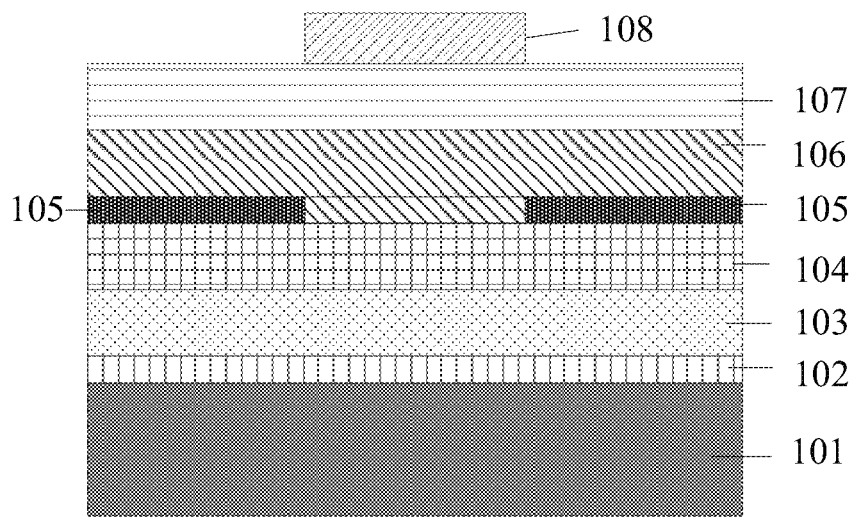
Figure 5:
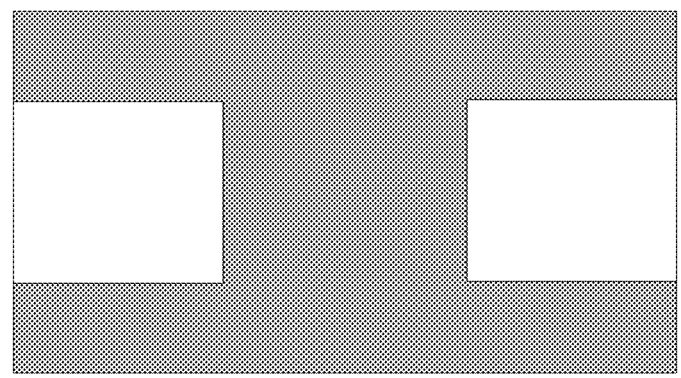
FIG. 5 is a schematic structural diagram of a first mask according to an embodiment of the present disclosure.
Figure 6:
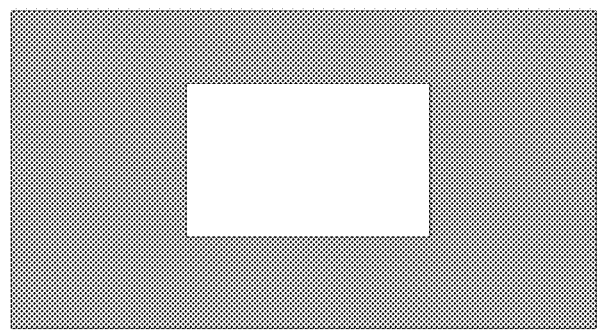
FIG. 6 is a schematic structural diagram of a second mask according to an embodiment of the present disclosure.

Referring to FIG. 4a-4h, FIG. 5 and FIG. 6, FIG. 4a-4h are schematic diagrams showing processes of a method for manufacturing an N-type bidirectional HEMT device based on $CH_3NH_3PbI_3$ material according to an embodiment of the present disclosure; FIG. 5 is a schematic structural diagram of a first mask according to an embodiment of the present disclosure; and FIG. 6 is a schematic structural diagram of a second mask according to an embodiment of the present disclosure. The method for manufacturing an N-type bidirectional HEMT device based on $CH_3NH_3PbI_3$ material according to this embodiment is as follows.

Step 101, referring to FIG. 4a, a sapphire $Al_2O_3$ substrate 101 with a thickness of 200-600 μm is prepared.

Reasons for selecting sapphire $Al_2O_3$ as the substrate: due to the low price and good insulation performance of sapphire $Al_2O_3$, the longitudinal leakage of the bidirectional HEMT high electron mobility transistor is effectively prevented.

The substrate can be replaced by a 200-600 μm silicon substrate with 1 μm thermal oxidized $SiO_2$, but the insulating effect is deteriorated after the replacement, and the manufacturing process is more complicated.

Step 102, referring to FIG. 4b, a conductive glass FTO 102 is manufactured on the sapphire substrate 101 prepared in step 101 using a sol method. Specifically, the conductive glass FTO 102 may have a thickness of 100-300 nm.

5-16 ml of tetrabutyl titanate is added to 20-75 ml of twice distilled water, and then it is stirred for 3-5 h. The obtained precipitate is filtered, ished repeatedly and transferred to a three-necked flask. Then 100-300 ml of double distilled water and 3 ml of concentrated nitric acid are added to the three-necked flask, and stirred at 60-90° C. for 24-48 hours to obtain a transparent FTO sol.

Step 103, referring to FIG. 4c, a second light absorbing layer 103 made of $CH_3NH_3PbI_3$ material is spin-coated on the conductive glass FTO 102 prepared in step 102.

The $CH_3NH_3PbI_3$ light absorbing layer 103 is spin-coated on the FTO conductive glass obtained in the step 102 by a single spin coating method. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is positioned at 80° C. for 1 hour to obtain a $CH_3NH_3PbI_3$ solution. The $CH_3NH_3PbI_3$ solution is added drop by drop onto the conductive glass obtained in the step 102, and annealed at 100° C. for 20 minutes to form a $CH_3NH_3PbI_3$ light absorbing layer with a thickness of 200-300 nm.

Step 104, referring to FIG. 4d, $TiO_2$ material is deposited on the second light absorbing layer 103 by a magnetron sputtering process or an atomic layer deposition process to form a second electron transport layer 104.

The sputtering target used in the magnetron sputtering process is a $TiO_2$ target with a mass percentage >99.99%, a target diameter of 50 mm, and a thickness of 1.5-3 mm. Before sputtering, the chamber of the magnetron sputtering device is cleaned with high purity argon gas for 5 minute and then vacuumed with a vacuum degree of $1.3\times10^{-3}$-$3\times10^{-3}$ Pa. Subsequently, Ar and $O_2$ are sequentially introduced into the reaction chamber, and the volume ratio of Ar to $O_2$ is controlled to be 9:1 by adjusting the flow rate, so that the total pressure is maintained at 2.0 Pa. Then $TiO_2$ material is deposited under conditions that sputtering power is 60-80 W and annealing temperature is at 70-150° C. after depositing, to prepare a $TiO_2$ electron transport layer on the light absorbing layer. The transport layer has a thickness of 50-200 nm.

Step 105, referring to FIG. 4e and FIG. 5, a source/drain electrode 105 made of Au material is magnetron-sputtered on the $CH_3NH_3PbI_3$ second light absorbing layer 104 via a first mask.

Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A source/drain electrode Au is manufactured under the conditions that a vacuum is $6\times10^{-4}$-$1.3\times10^{-3}$ Pa, an Ar flow rate is 20-30 cm³/s, a target base distance is 10 cm, and a working power is 20-100 W. The thickness of the source/drain electrode Au is 100-300 nm.

The source/drain electrode 105 may be replaced by metals such as Al, Ti, Ni, Ag, or Pt. Among them, Au, Ag and Pt are chemically stable; Al, Ti and Ni are low in cost.

Step 106, referring to FIG. 4f, an electron transport layer 106 made of $TiO_2$ material is deposited by a magnetron sputtering process or an atomic layer deposition process.

The sputtering target used in the magnetron sputtering process is a $TiO_2$ target with a mass percentage >99.99%, a target diameter of 50 mm, and a thickness of 1.5-3 mm. Before sputtering, the chamber of the magnetron sputtering device is cleaned with high purity argon gas for 5 minute and then vacuumed with a vacuum degree of $1.3\times10^{-3}$-$3\times10^{-3}$ Pa. Subsequently, Ar and $O_2$ are sequentially introduced into the reaction chamber, and the volume ratio of Ar to $O_2$ is controlled to be 9:1 by adjusting the flow rate, so that the total pressure is maintained at 2.0 Pa. Then $TiO_2$ material is deposited under conditions that sputtering power is 60-80 W and annealing temperature is at 70-150° C. after depositing, to prepare a $TiO_2$ electron transport layer on the substrate and the source/drain electrodes. The electron transport layer has a thickness of 150-500 nm.

Step 107, referring to FIG. 4g, $CH_3NH_3PbI_3$ material is spin-coated on the first electron transport layer 106 to form a first light absorbing layer 107.

The $CH_3NH_3PbI_3$ light absorbing layer is spin-coated on the first electron transport layer 106 obtained in the step 107 by a single spin coating method. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is arranged at 80° C. for 1 hour to obtain a $CH_3NH_3PbI_3$ solution. The $CH_3NH_3PbI_3$ solution is added drop by drop onto the conductive glass obtained in the step 106, and annealed at 100° C. for 20 minutes to form a $CH_3NH_3PbI_3$ light absorbing layer with a thickness of 200-300 nm.

Step 108, referring to FIG. 4h and FIG. 6, a gate electrode 108 made of Au material is magnetron-sputtered on the $CH_3NH_3PbI_3$ light absorbing layer 107 via a second mask.

The gate electrode Au material is magnetron-sputtered on the light absorbing layer $CH_3NH_3PbI_3$ obtained in step 107 by a magnetron sputtering process. Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A gate electrode Au is prepared under the conditions that a vacuum is $6\times10^{-4}$-$1.3\times10^{-3}$ Pa, an Ar flow rate is 20-30 cm$^3$/s, a target base distance is 10 cm, and a working power is 20-100 W. The thickness of the gate electrode Au is 100-300 nm.

The gate electrode 108 may be replaced by metals such as Al, Ti, Ni, Ag, or Pt. Among them, Au, Ag and Pt are chemically stable; Al, Ti and Ni are low in cost.

In the embodiment of the present disclosure, by adopting a symmetrical light absorbing layer, more light can be absorbed to generate photogenerated carriers, and to enhance the performance of the device. In addition, use of transparent sapphire-growth transparent conductive glass FTO as the bottom gate electrode enables both upper and lower light to illuminate the light absorbing layer, thereby enhancing device performance. CH$_3$NH$_3$PbI$_3$ provides a large amount of electrons to the channel to form a bidirectional HEMT high electron mobility transistor, which has the advantages of high mobility, fast switching speed, enhanced light absorption, increased photogenerated carriers, enhanced transmission characteristics, and high photoelectric conversion efficiency.

[Embodiment 2] Enhanced Heterojunction HEMT

Figure 7:
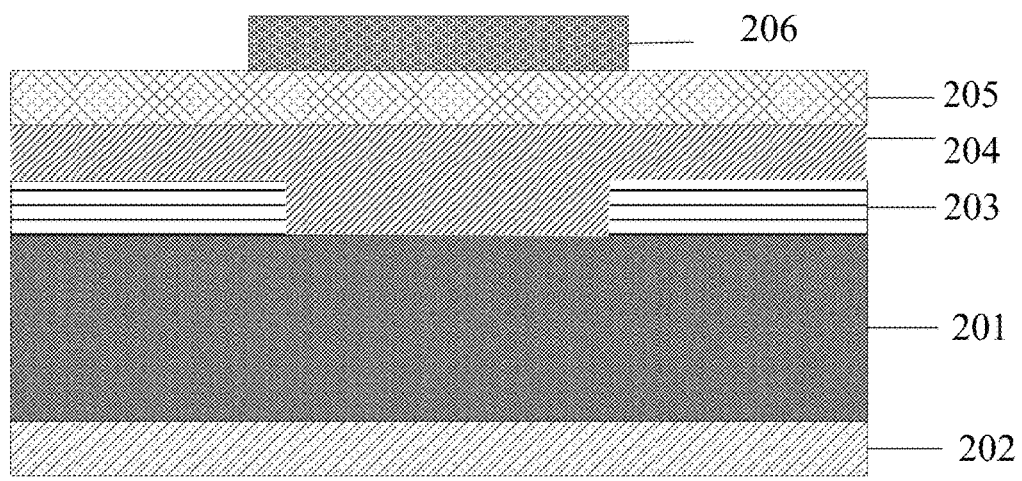
FIG. 7 is a schematic cross-sectional view of an enhanced heterojunction HEMT based on $CH_3NH_3PbI_3$ material according to an embodiment of the present disclosure.
Figure 8:
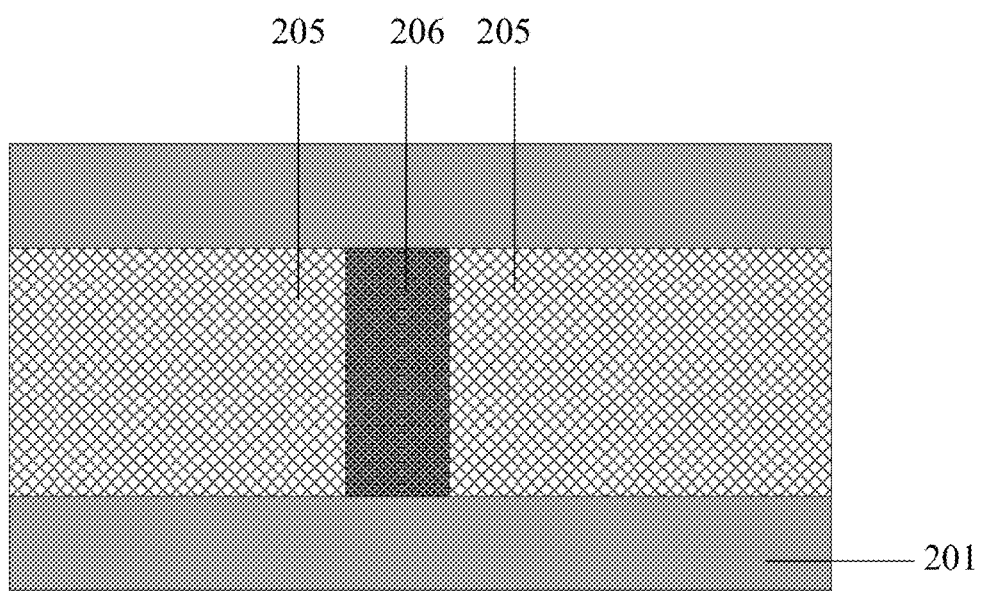
FIG. 8 is a schematic cross-sectional view of an enhanced heterojunction HEMT based on $CH_3NH_3PbI_3$ material according to an embodiment of the present disclosure.

Referring to FIG. 7 and FIG. 8, FIG. 7 is a schematic cross-sectional view of an enhanced heterojunction HEMT based on CH$_3$NH$_3$PbI$_3$ material according to an embodiment of the present disclosure, and FIG. 8 is a schematic cross-sectional view of an enhanced heterojunction HEMT based on CH$_3$NH$_3$PbI$_3$ material according to an embodiment of the present disclosure. The enhanced heterojunction HEMT may include an Al$_2$O$_3$ substrate 201, a light reflecting layer 202, a source/drain electrode 203, a first electron transport layer 204, a first light absorbing layer 205, and a gate electrode 206. Wherein the sapphire substrate 201, the light reflecting layer 202, the source/drain electrodes 203, the first electron transporting layer 204, the first light absorbing layer 205 and the gate electrode 206 are sequentially formed in a multilayer structure.

The reflective layer 202 may be silver material or material such as Al or Cu. The source/drain electrode 203 may be Au material or metals such as Al, Ti, Ni, Ag, or Pt. Among them, Au, Ag and Pt are chemically stable; Al, Ti and Ni are low in cost. The first electron transport layer 204 may be TiO$_2$ material, the first light absorbing layer 205 may be CH$_3$NH$_3$PbI$_3$/PCBM material, and the gate electrode 206 may be Au material.

Figure 9:
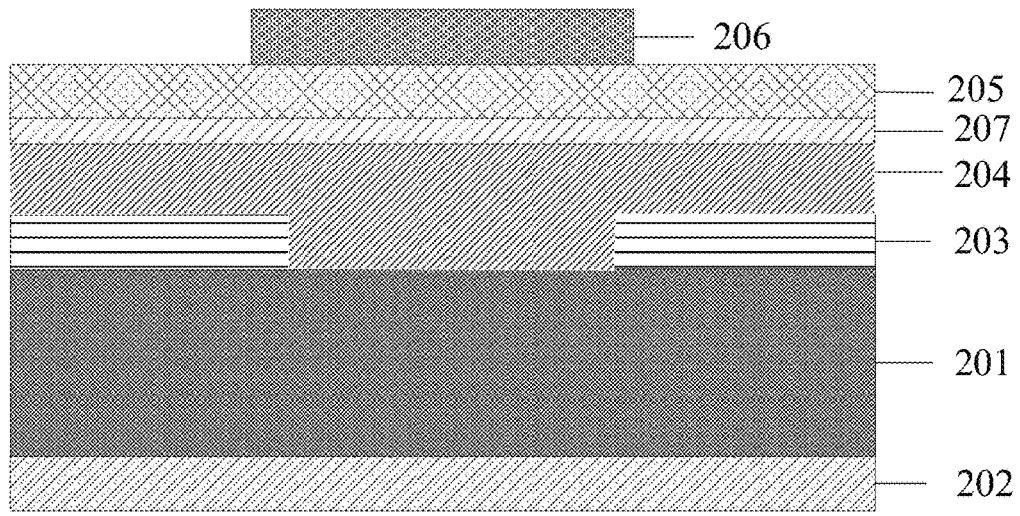
FIG. 9 is a schematic cross-sectional view of another enhanced heterojunction HEMT based on $CH_3NH_3PbI_3$ material according to an embodiment of the present disclosure.

Optionally, referring to FIG. 9, FIG. 9 is a schematic cross-sectional view of another enhanced heterojunction HEMT based on CH$_3$NH$_3$PbI$_3$ material according to an embodiment of the present disclosure. The enhanced heterojunction HEMT can also include an active layer 207, which can be made of PCBM material. At this time, the first light absorbing layer 205 may simply use CH$_3$NH$_3$PbI$_3$ material.

The PCBM material is a fullerene derivative with a molecular formula of [6,6]-phenyl-C61-butyric acid methyl ester. Due to the good solubility, high electron mobility, and good phase separation of PCBM material from common polymer donor materials, it has become the standard for electron acceptors of organic solar cells. The present disclosure utilizes this feature and is very clever for using the PCBM material in the HEMT device shown in FIG. 7 or FIG. 9, as an active layer with buffering properties, which can improve the quality of the light absorbing layer film by filling holes and vacancies, thereby producing larger grains and fewer grain boundaries, absorbing more light to generate photogenerated carriers, and enhancing device performance.

It should be noted that the CH$_3$NH$_3$PbI$_3$ material is highly suitable for photodetection in the visible range due to its high responsivity in the near-infrared and visible range. It has high photoelectric sensitivity and high electron mobility and good electrical conductivity and is an ideal material for the preparation of HEMT.

Figure 10A:
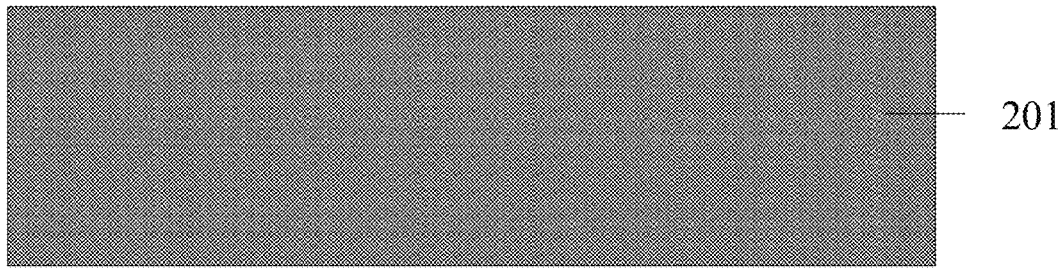
FIG. 10a-10f are schematic diagrams showing processes of a method for manufacturing an enhanced heterojunction HEMT based on $CH_3NH_3PbI_3$ material according to an embodiment of the present disclosure.
Figure 10B:
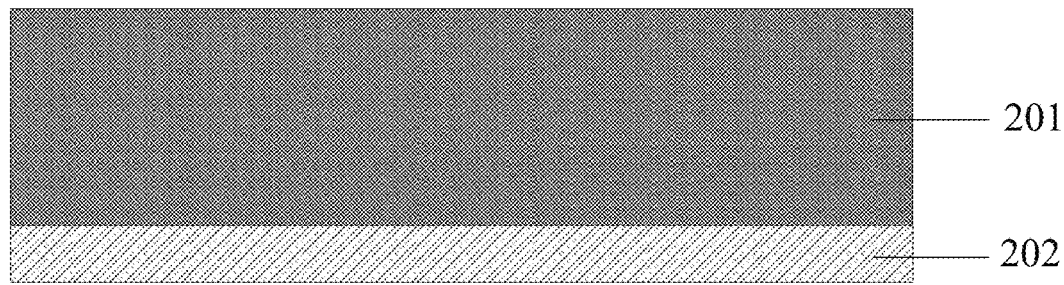
Figure 10C:
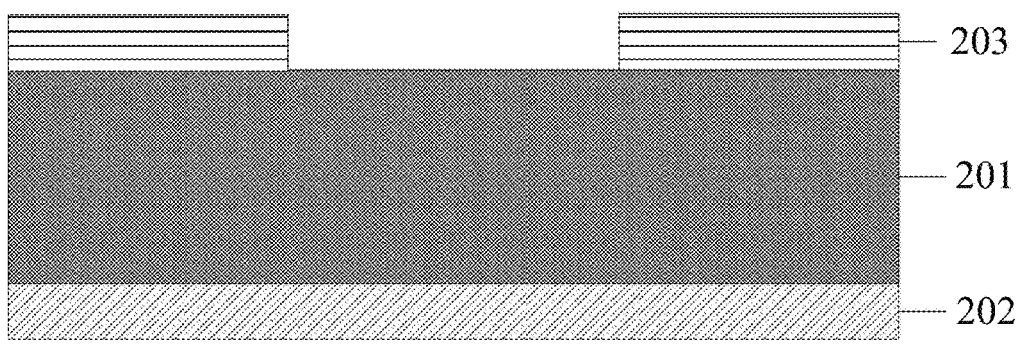
Figure 10D:
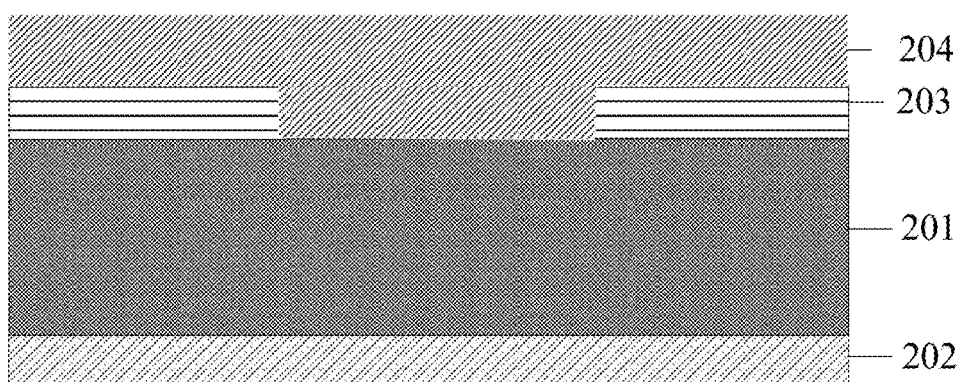
Figure 10E:
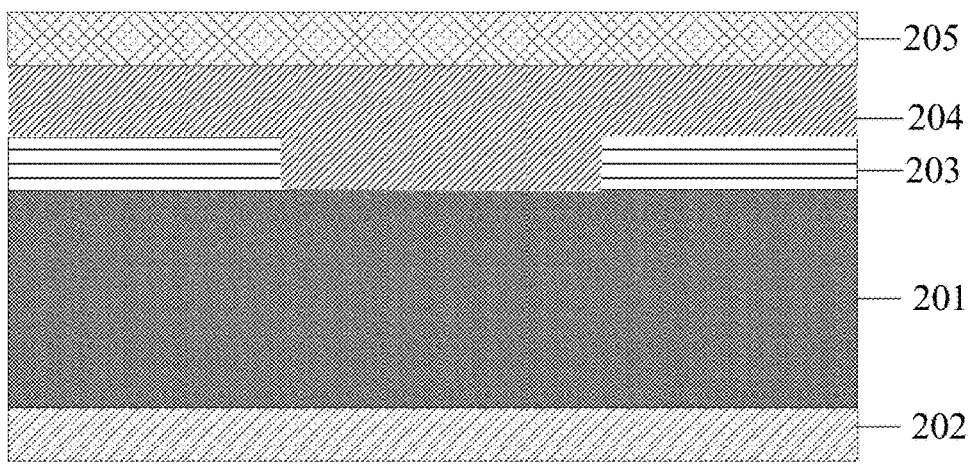
Figure 10F:
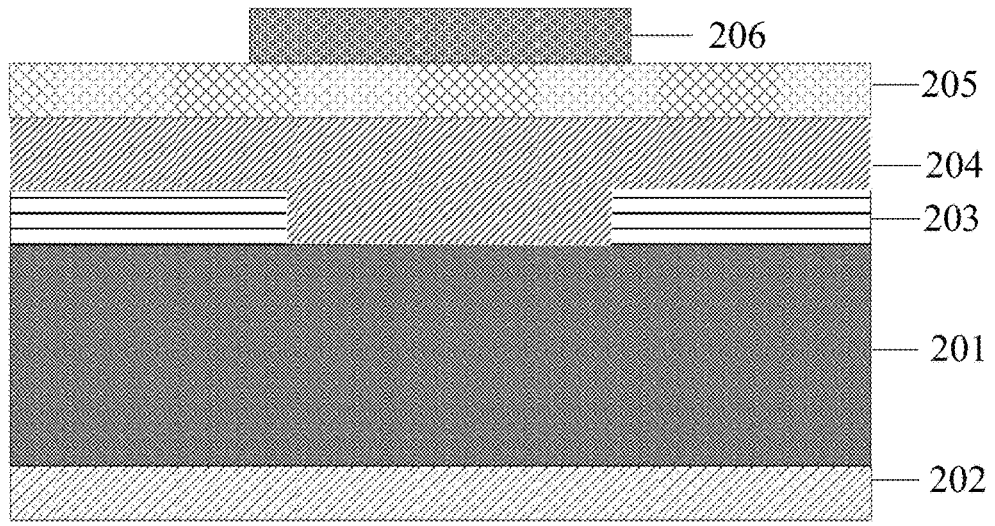
Figure 11:
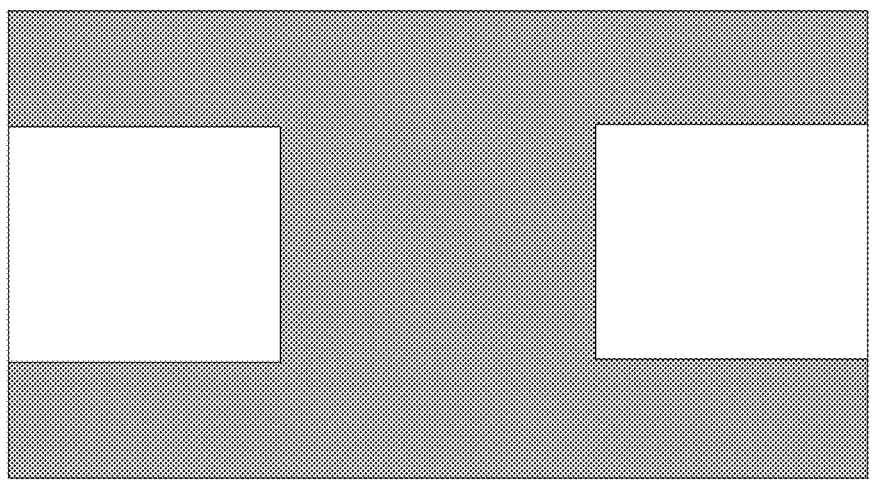
FIG. 11 is a schematic structural diagram of a third physical mask according to an embodiment of the present disclosure.
Figure 12:
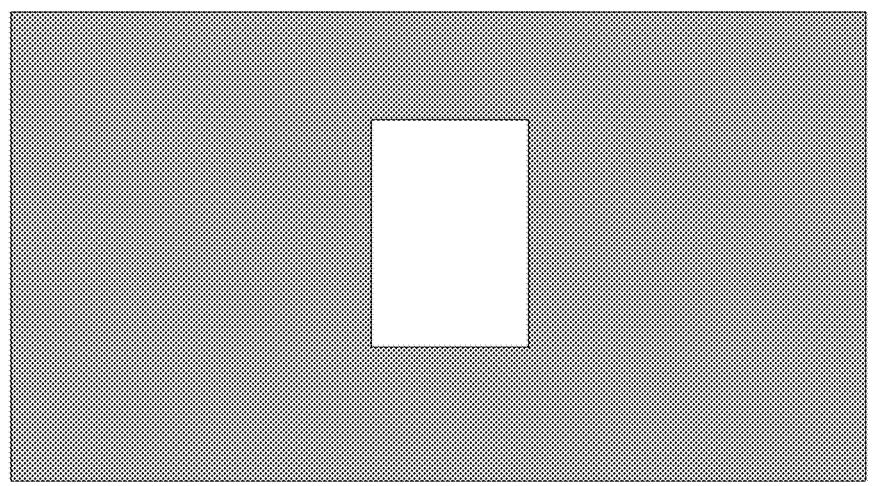
FIG. 12 is a schematic structural diagram of a fourth physical mask according to an embodiment of the present disclosure.

Referring to FIG. 10*a*-10*f*, FIG. 11 and FIG. 12, FIG. 10*a*-10*f* are schematic diagrams showing processes of a method for manufacturing an enhanced heterojunction HEMT based on CH$_3$NH$_3$PbI$_3$ material, according to an embodiment of the present disclosure; FIG. 11 is a schematic structural diagram of a third physical mask according to an embodiment of the present disclosure; and FIG. 12 is a schematic structural diagram of a fourth physical mask according to an embodiment of the present disclosure. The preparation method of the enhanced heterojunction HEMT is described in detail as follows.

Step 201: referring to FIG. 10*a*, an Al$_2$O$_3$ substrate 201 with a thickness of 200-600 μm is prepared.

Step 202: referring to FIG. 10*b*, a gate electrode made of Ag material is magnetron-sputtered on the back side of the Al$_2$O$_3$ substrate 201 to form a reflective layer 202.

Ag material is magnetron-sputtered on the back side of the substrate obtained in the step 201 by a magnetron sputtering process. Ag with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A reflective silver mirror is manufacturing under the conditions that a vacuum is $6\times10^{-4}$-$1.3\times10^{-3}$ Pa, an Ar flow rate is 20-30 cm$^3$/s, a target base distance is 10 cm, and a working power is 20-100 W. The thickness of the electrode is 100-300 nm.

Step 203: referring to FIG. 10*c* and FIG. 11, using a third physical mask, Au material is magnetron-sputtered on the Al$_2$O$_3$ substrate 201 to form a source/drain electrode 203.

Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A source/drain electrode Au is manufactured under the conditions that a vacuum is $6\times10^{-4}$-$1.3\times10^{-3}$ Pa, an Ar flow rate is 20-30 cm$^3$/s, a target base distance is 10 cm, and a working power is 20-100 W. The thickness of the source/drain electrode Au is 100-300 nm.

Step 204: referring to FIG. 10*d*, TiO$_2$ material is deposited on the source/drain electrode 203 prepared in step 203 and on the uncovered portion of the substrate, by a magnetron sputtering process or an atomic layer deposition process to form a first electron transport layer 204.

The sputtering target used in the magnetron sputtering process is a TiO$_2$ target with a mass percentage >99.99%, a target diameter of 50 mm, and a thickness of 1.5-3 mm. Before sputtering, the chamber of the magnetron sputtering device is cleaned with high purity argon gas for 5 minute and then vacuumed with a vacuum degree of $1.3\times10^{-3}$-$3\times10^{-3}$ Pa. Subsequently, Ar and O$_2$ are sequentially introduced into the reaction chamber, and the volume ratio of Ar to O$_2$ is controlled to be 9:1 by adjusting the flow rate, so that the total pressure is maintained at 2.0 Pa. Then TiO$_2$ material is deposited under conditions that sputtering power is 60-80 W and annealing temperature is 70-150° C. after depositing, to prepare a first electron transport layer 204 on the source/ drain electrodes and on the uncovered substrate. The first electron transport layer 204 has a thickness of 50-200 nm.

Step 205: referring to FIG. 10e, a first light absorbing layer 205 is manufactured on the first electron transport layer 204 by a single spin coating method.

The $CH_3NH_3PbI_3$ light absorbing layer 103 is spin-coated on the first electron transport layer 204 obtained in the step 204 by a single spin coating method. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is stand at 80° C. for 1 hour to obtain a $CH_3NH_3PbI_3$ solution. The mixed solution of $CH_3NH_3PbI_3$: PCBM=100:1 is added drop by drop onto the $TiO_2$ film obtained in the step 204, and annealed at 100° C. for 20 minutes to form a $CH_3NH_3PbI_3$/PCBM first light absorbing layer 205 with a thickness of 200-300 nm.

Step 206: referring to FIG. 10f and FIG. 12, using a fourth physical mask, a gate electrode 206 is magnetron-sputtered on the first light absorbing layer 205.

Au material is magnetron-sputtered on the light absorbing layer obtained in step 205 by a magnetron sputtering process. Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A gate electrode 206 is manufactured under the conditions that a vacuum is $6\times10^{-4}$-$1.3\times10^{-3}$ Pa, an Ar flow rate is 20-30 $cm^3$/s, a target base distance is 10 cm, and a working power is 20-100 W. The thickness of the gate electrode 206 is 100-300 nm.

Optionally, the step 205 can be replaced with the following step 205'.

Step 205', an active layer of PCBM material is spin-coated on the first electron transport layer 204, the mass concentration of the PCBM material is 8 mg/ml, and preferably is 16 ml. The solvent of the active layer solution is selected from chlorobenzene, which is spin-coated in a glove box filled with an inert gas, and then annealed at 50-200° C. for 10-100 min. The thickness of the active layer is 20-100 nm. A $CH_3NH_3PbI_3$ light absorbing layer is spin-coated on the obtained active layer by a single spin coating process. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is standed at 80° C. for 1 hour to obtain a $CH_3NH_3PbI_3$ solution. The $CH_3NH_3PbI_3$ solution is added drop by drop to the conductive glass obtained in the step 205', and annealed at 100° C. for 20 minutes to form a first light absorbing layer with a thickness of 200-300 nm.

Accordingly, the HEMT device prepared in step 205' is shown in FIG. 9.

In this embodiment, a large amount of electrons are supplied to the channel by $CH_3NH_3PbI_3$, and Ag is planted on the lower surface of the substrate to form a reflection-enhanced HEMT, the reflection-enhanced HEMT has high mobility, fast switching speed, enhanced light absorption and light utilization efficiency, increased photogenerated carriers, enhanced transmission characteristics, and large photoelectric conversion efficiency. In addition, by adding a PCBM material to the light absorbing layer to form a heterojunction, the quality of the light absorbing layer film can be improved by filling the holes and vacancies, thereby generating larger crystal grains and less grain boundaries, and absorbing more light to produce photo-generated carriers, thereby enhancing the performance of the device.

The following focuses on two structures of HHMT devices.

[Embodiment 3] Bidirectional HHET Device

Figure 13:
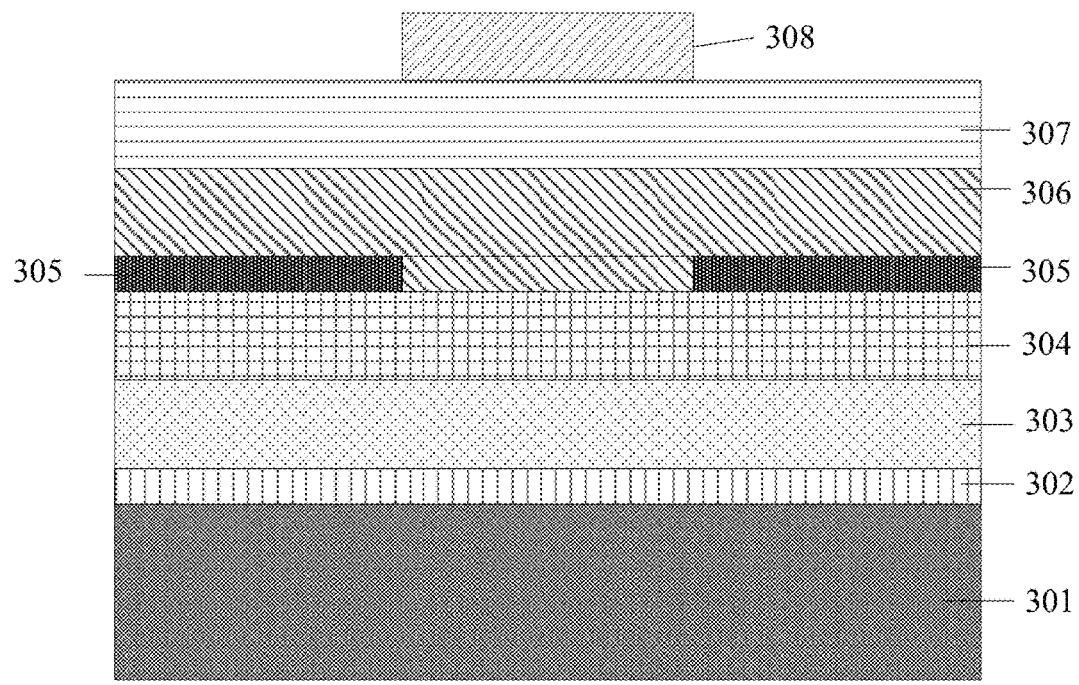
FIG. 13 is a schematic cross-sectional view of a P-type bidirectional HHET device based on $CH_3NH_3PbI_3$ material according to an embodiment of the present disclosure.
Figure 14:
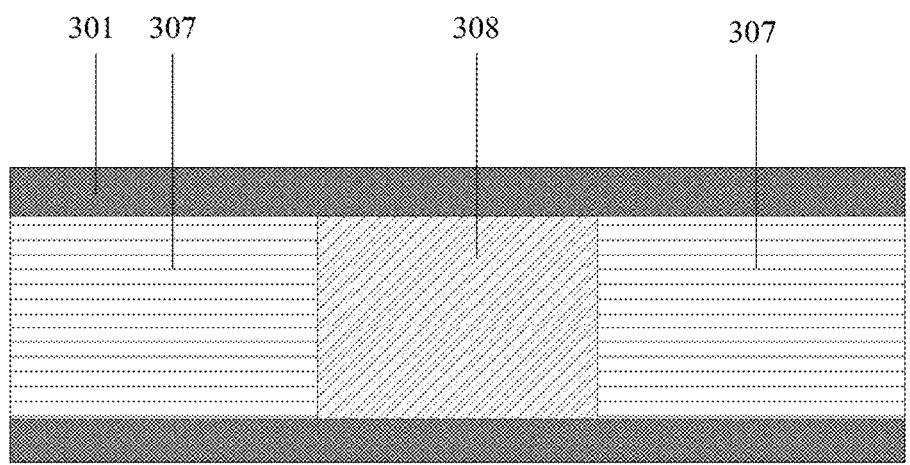
FIG. 14 is a schematic top view of a P-type bidirectional HHET device based on $CH_3NH_3PbI_3$ material according to an embodiment of the present disclosure.

Referring to FIG. 13 and FIG. 14, FIG. 13 is a schematic cross-sectional view of a P-type bidirectional HHET device based on $CH_3NH_3PbI_3$ material according to an embodiment of the present disclosure; and FIG. 14 is a schematic top view of a P-type bidirectional HHET device based on $CH_3NH_3PbI_3$ material according to an embodiment of the present disclosure. The P-type bidirectional HHET device may include an $Al_2O_3$ substrate 301, a conductive glass 302, a fourth light absorbing layer 303, a second hole transport layer 304, a source/drain electrode 305, a first hole transport layer 306, a third light absorption layer 307, and a gate electrode 308. The material of the substrate 301, the conductive glass 302, the fourth light absorbing layer 303, the second hole transport layer 304, the source/drain electrode 305, the first hole transport layer 306, the first light absorbing layer 307, and the gate electrode 308 are vertically distributed from bottom to top orderly to form a multi-layer symmetrical structure, thereby forming a bidirectional P-type HHET device.

The source/drain electrode 305 may be Au material or Al, Ti, Ni, Ag, Pt or the like, wherein Au, Ag, and Pt are chemically stable, and Al, Ti, and Ni are low in cost. The second hole transport layer 304 and the first hole transport layer 306 may be Spiro-OMeTAD material, and the fourth light absorbing layer 303 and the third light absorbing layer 307 may be $CH_3NH_3PbI_3$ material, and the gate electrode 308 may be Al, Ti, Ni, Ag, Pt or the like material, wherein Au, Ag, and Pt are chemically stable, and Al, Ti, and Ni are low in cost.

Figure 15A:
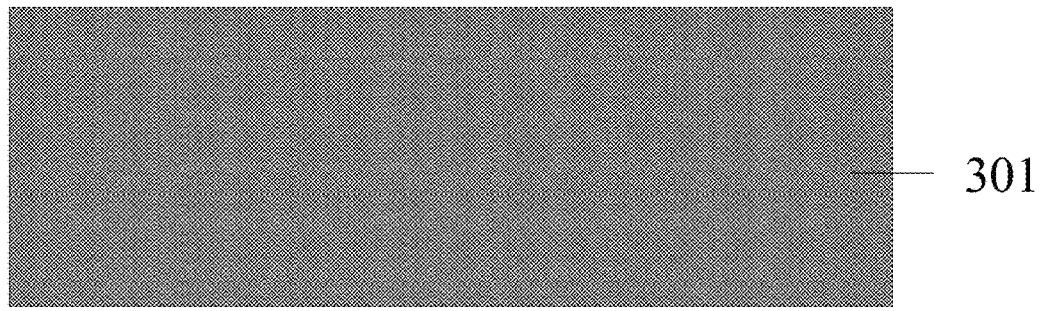
FIG. 15a-15h are schematic diagrams showing processes of a method for manufacturing a P-type bidirectional HHET device based on $CH_3NH_3PbI_3$ material according to an embodiment of the present disclosure.
Figure 15B:
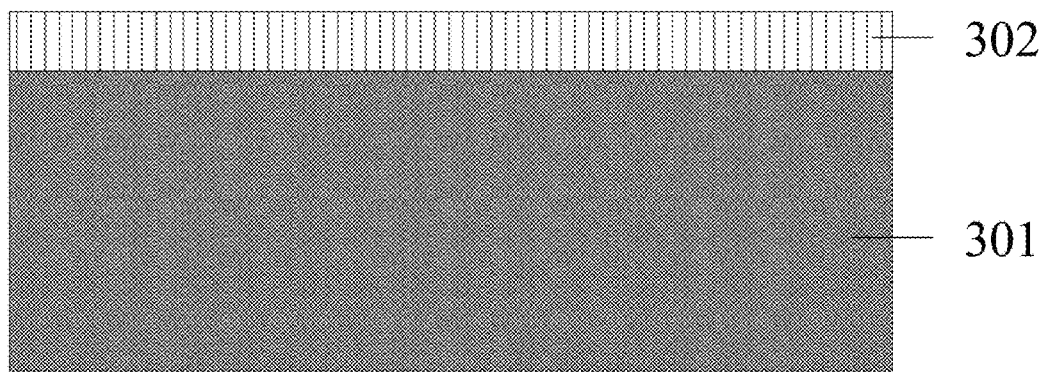
Figure 15C:
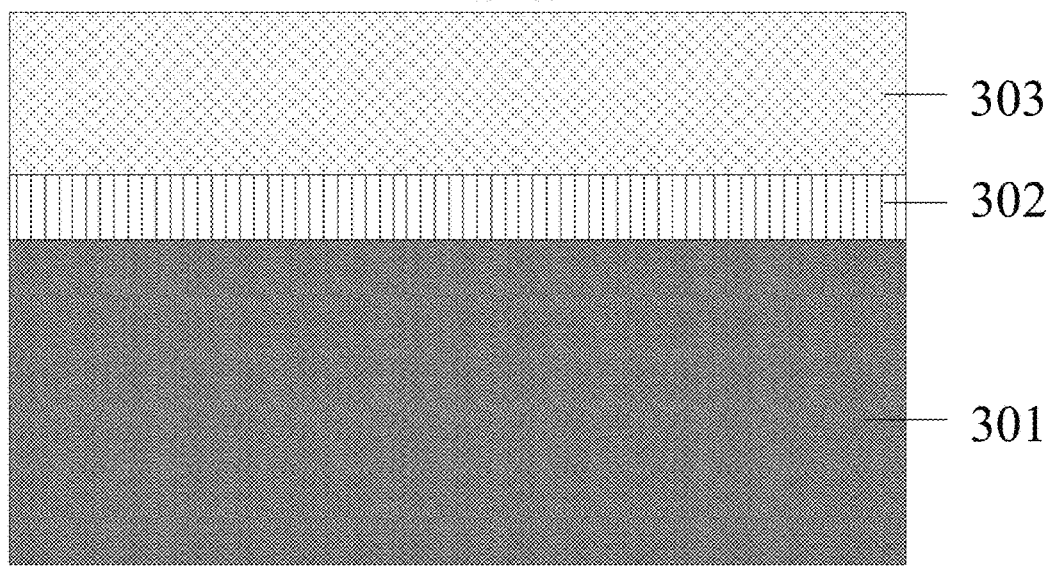
Figure 15D:
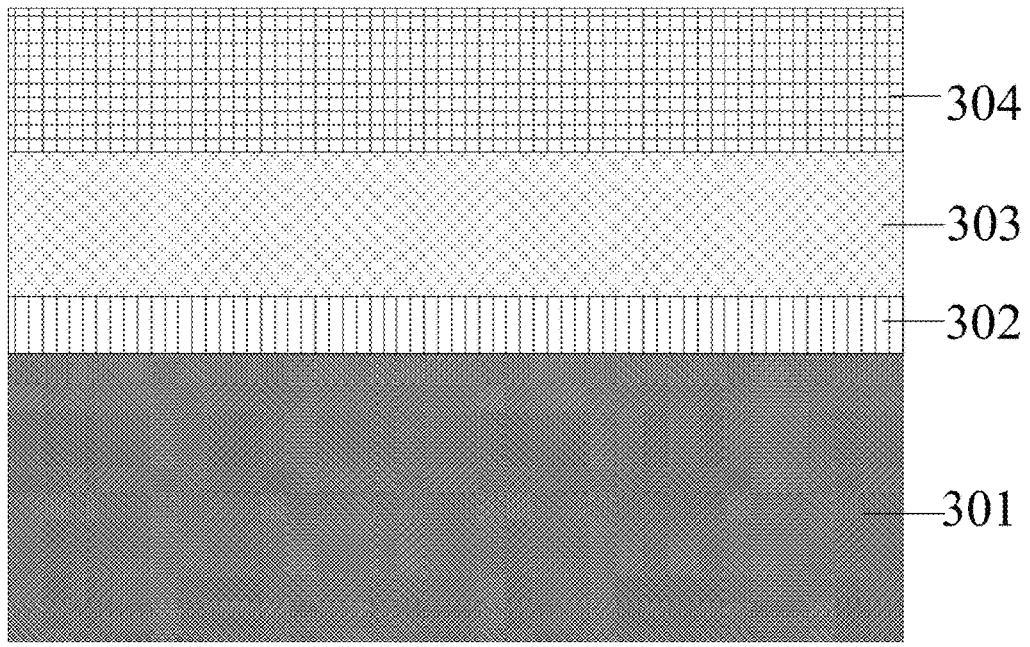
Figure 15E:
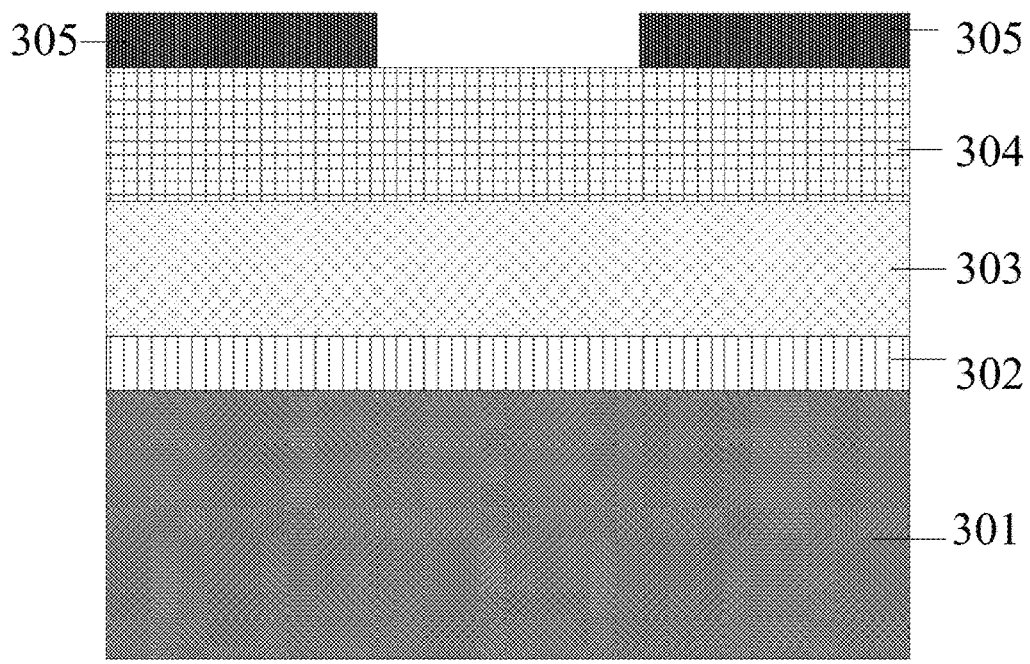
Figure 15F:
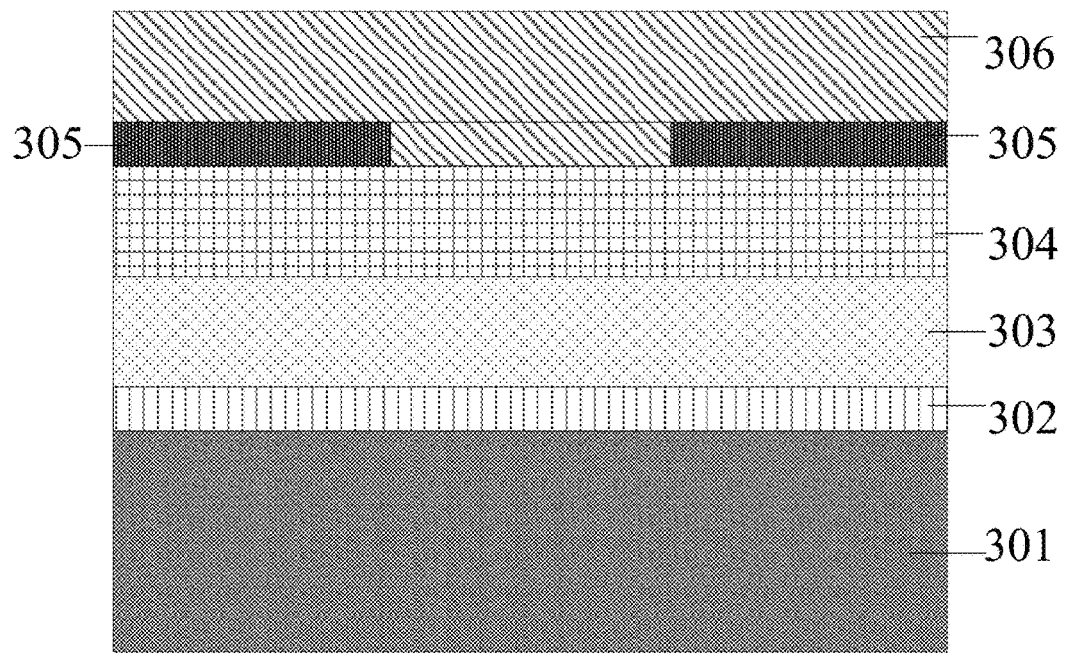
Figure 15G:
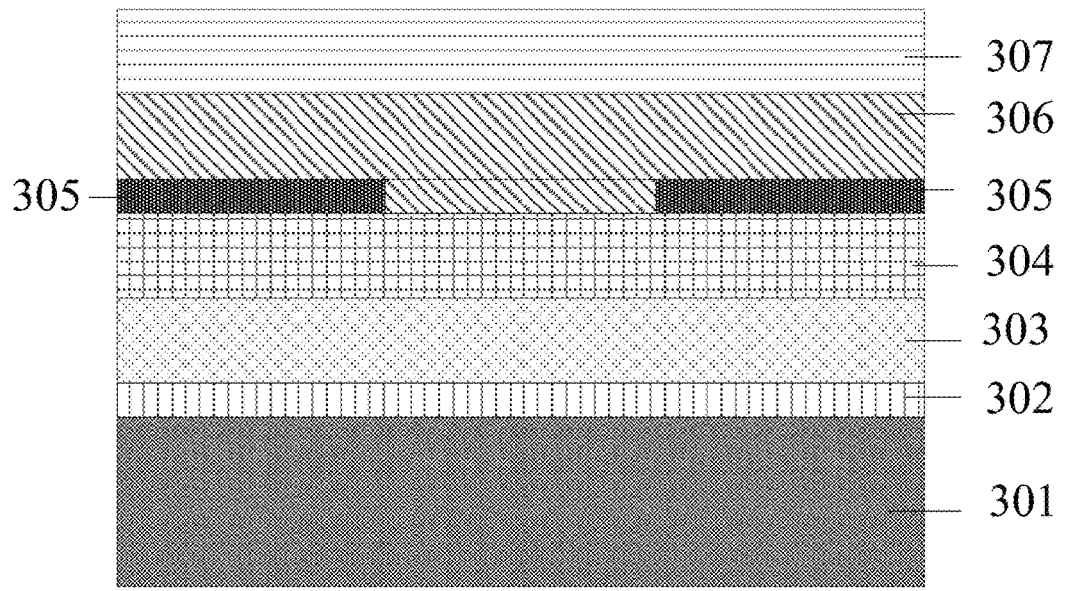
Figure 15H:
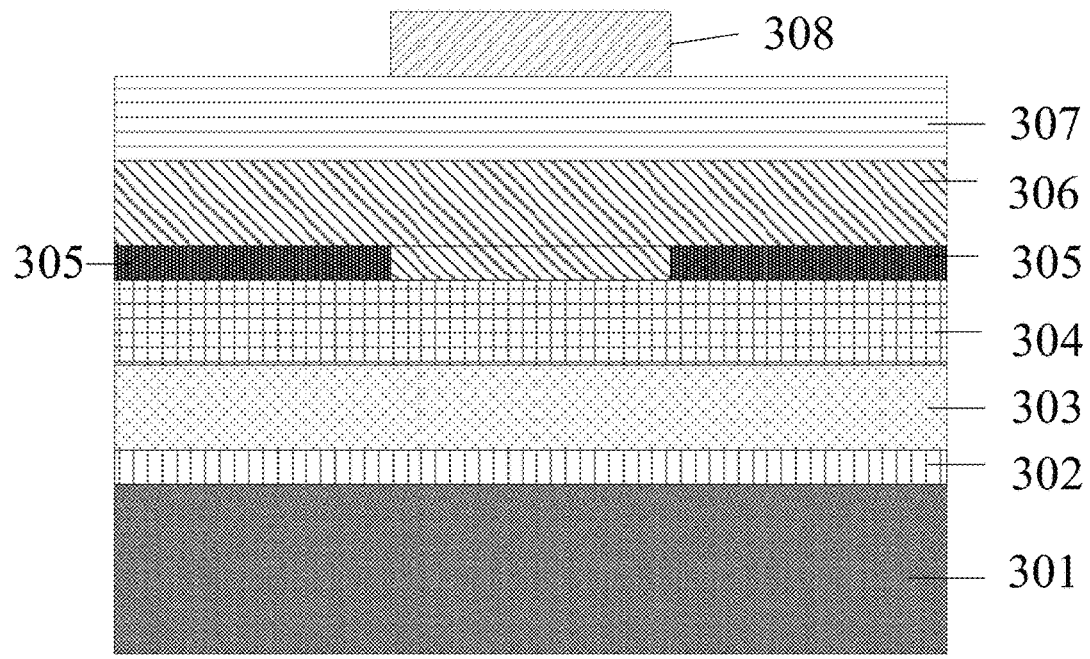
Figure 16:
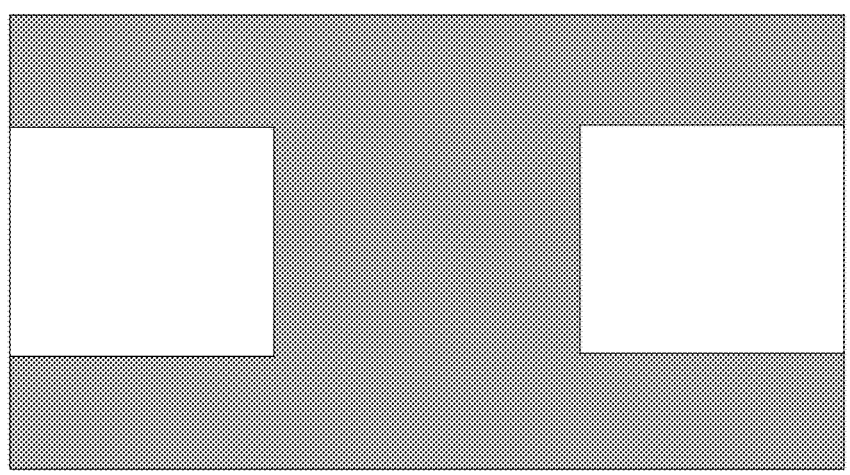
FIG. 16 is a schematic structural diagram of a fifth mask according to an embodiment of the present disclosure.
Figure 17:
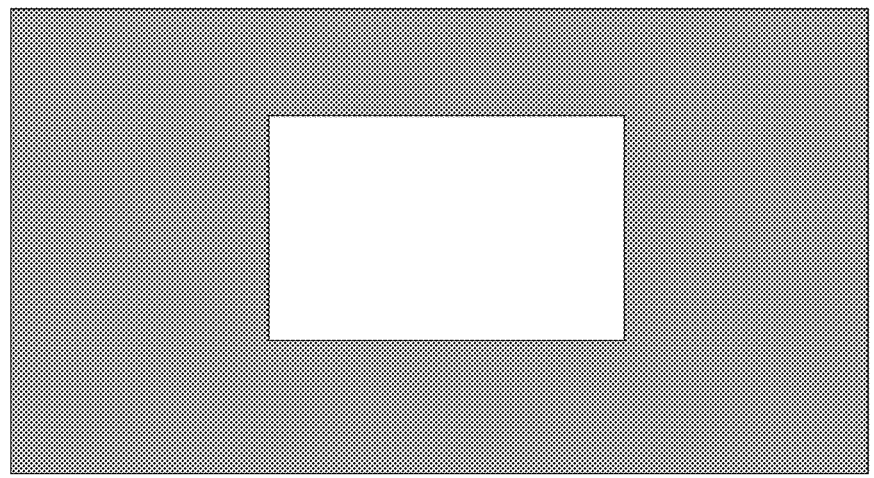
FIG. 17 is a schematic structural diagram of a sixth mask according to an embodiment of the present disclosure.

Referring to FIG. 15a-FIG. 15h, FIG. 16 and FIG. 17, FIG. 15a-15h are schematic diagrams showing processes of a method for manufacturing a P-type bidirectional HHET device based on $CH_3NH_3PbI_3$ material according to an embodiment of the present disclosure; FIG. 16 is a schematic structural diagram of a fifth mask according to an embodiment of the present disclosure; and FIG. 17 is a schematic structural diagram of a sixth mask according to an embodiment of the present disclosure. The preparation method of the P-type bidirectional HHET device based on $CH_3NH_3PbI_3$ material is described in detail as follows.

Step 301, referring to FIG. 15a, a sapphire $Al_2O_3$ substrate 301 with a thickness of 200-600 μm is prepared.

The substrate may be replaced by a 200-600 μm silicon substrate thermally oxidized with 1 μm $SiO_2$, but the insulating effect is deteriorated after the replacement, and the manufacturing process is more complicated.

Step 302, referring to FIG. 15b, a FTO conductive glass 302 is manufactured on the $Al_2O_3$ substrate 301 prepared in step 301 using a sol method. Specifically, the FTO conductive glass 302 may have a thickness of 100-300 nm.

5-16 ml of tetrabutyl titanate is added to 20-75 ml of twice distilled water and then it is stirred for 3-5 h. The obtained precipitate is filtered, ished repeatedly and transferred to a three-necked flask. Then 100-300 ml of double distilled water and 3 ml of concentrated nitric acid are added to the three-necked flask, and stirred at 60-90° C. for 24-48 hours to obtain a transparent FTO sol. Then the FTO sol is painted onto the $Al_2O_3$ substrate 301, and stand, to form an FTO conductive glass 302.

Step 303, referring to FIG. 15c, $CH_3NH_3PbI_3$ material is spin-coated on the FTO conductive glass 302 prepared in step 302 to form a fourth light absorbing layer 303.

The $CH_3NH_3PbI_3$ light absorbing layer 303 is spin-coated on the FTO conductive glass obtained in the step 302 by a single spin coating method. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is standed at 80° C. for 1 hour to obtain a $CH_3NH_3PbI_3$ solution. The $CH_3NH_3PbI_3$ solution is added drop by drop onto the conductive glass obtained in the step 302, and annealed at 100° C. for 20 minutes to form a fourth light absorbing layer 303 with a thickness of 200-300 nm.

Step 304, referring to FIG. 15d, a hole transport layer Spiro-OMeTAD material is spin-coated on the fourth light absorbing layer 303.

A solution of Spiro-OMeTAD in chlorobenzene at a concentration of 72.3 mg/mL is prepared, and a solution of 520 mg/mL lithium salt in acetonitrile, tetra-tert-butylpyridine and 300 mg/mL cobalt salt in acetonitrile is added, and the volume ratio of the three is 10:17:11. The solution is stirred at room temperature for 1 h, then the Spiro-OMeTAD solution is obtained. The Spiro-OMeTAD solution is added drop by drop onto the prepared fourth light absorbing layer 303, and then spin-coated to obtain a Spiro-OMeTAD second hole transport layer 304. The second hole transport layer has a thickness of 50-200 nm.

Step 305, referring to FIG. 15e and FIG. 16, using a fifth mask, a source/drain electrode 305 made of Au material is magnetron-sputtered on the second hole transport layer 304.

Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A source/drain electrode 305 is manufactured under the conditions that a vacuum is $6\times10^{-4}$-$1.3\times10^{-3}$ Pa, an Ar flow rate is 20-30 cm$^3$/s, a target base distance is 10 cm, and a working power is 20-100 W. The thickness of the source/drain electrode 305 is 100-300 nm.

Step 306, referring to FIG. 15f, Spiro-OMeTAD material is spin-coated on the source/drain electrodes 305 and the second hole transport layer 304.

A solution of Spiro-OMeTAD in chlorobenzene at a concentration of 72.3 mg/mL is prepared, and a solution of 520 mg/mL lithium salt in acetonitrile, tetra-tert-butylpyridine and 300 mg/mL cobalt salt in acetonitrile is added, and the volume ratio of the three is 10:17:11. The solution is stirred at room temperature for 1 h, the Spiro-OMeTAD solution is obtained. The Spiro-OMeTAD solution is added drop by drop onto the prepared fourth light absorbing layer 303, and then spin-coated to obtain a first hole transport layer 306 with a thickness of 50-200 nm.

Step 307, referring to FIG. 15g, $CH_3NH_3PbI_3$ material is spin-coated on the first hole transport layer 306 to form a third light absorbing layer 307.

$CH_3NH_3PbI_3$ material is spin-coated on the first hole transport layer 306 obtained in the step 307 by a single spin coating method. Specifically, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is standed at 80° C. for 1 hour to obtain a $CH_3NH_3PbI_3$ solution. The $CH_3NH_3PbI_3$ solution is added drop by drop onto Spiro-OMeTAD hole transport layer obtained in the step 306, and annealed at 100° C. for 20 minutes to form a third light absorbing layer 307 with a thickness of 200-300 nm.

Step 308, referring to FIG. 15h and FIG. 17, a gate electrode 308 made of Au material is magnetron-sputtered on the third light absorbing layer 307 via a sixth mask.

The gate electrode Au material is magnetron-sputtered third light absorbing layer 307 obtained in step 307 by a magnetron sputtering process. Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A gate electrode 308 is manufactured under the conditions that a vacuum is $6\times10^{-4}$-$1.3\times10^{-3}$ Pa, an Ar flow rate is 20-30 cm$^3$/s, a target base distance is 10 cm, and a working power is 20-100 W. The thickness of the gate electrode 308 is 100-300 nm.

In the embodiment of the present disclosure, by adopting a symmetrical light absorbing layer, more light can be absorbed to generate photo-generated carriers, and to enhance the performance of the device. In addition, by forming transparent FTO conductive glass in transparent sapphire as a bottom gate electrode, both upper and lower illumination can illuminate the light absorbing layer, and the performance of the device can be enhanced; again, a large number of holes are provided to the channel by $CH_3NH_3PbI_3$ to form a bidirectional HHET, which has high mobility, fast switching speed, enhanced light absorption, and increased photogenerated carriers, enhanced transmission characteristics, and large photoelectric conversion efficiency.

[Embodiment 4] Enhanced Heterojunction HHMT

Figure 18:
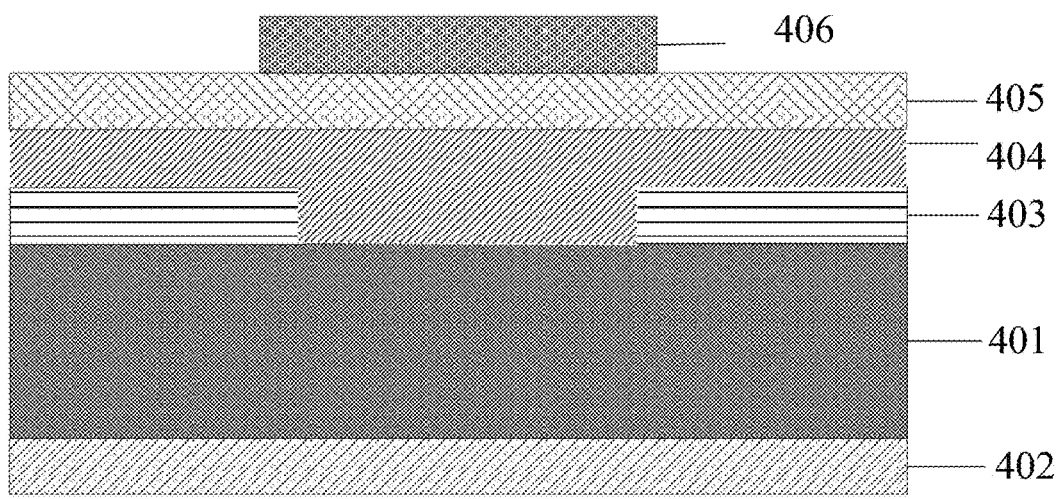
FIG. 18 is a schematic cross-sectional view of an enhanced heterojunction HHMT based on a $CH_3NH_3PbI_3$ material according to an embodiment of the present disclosure.
Figure 19:
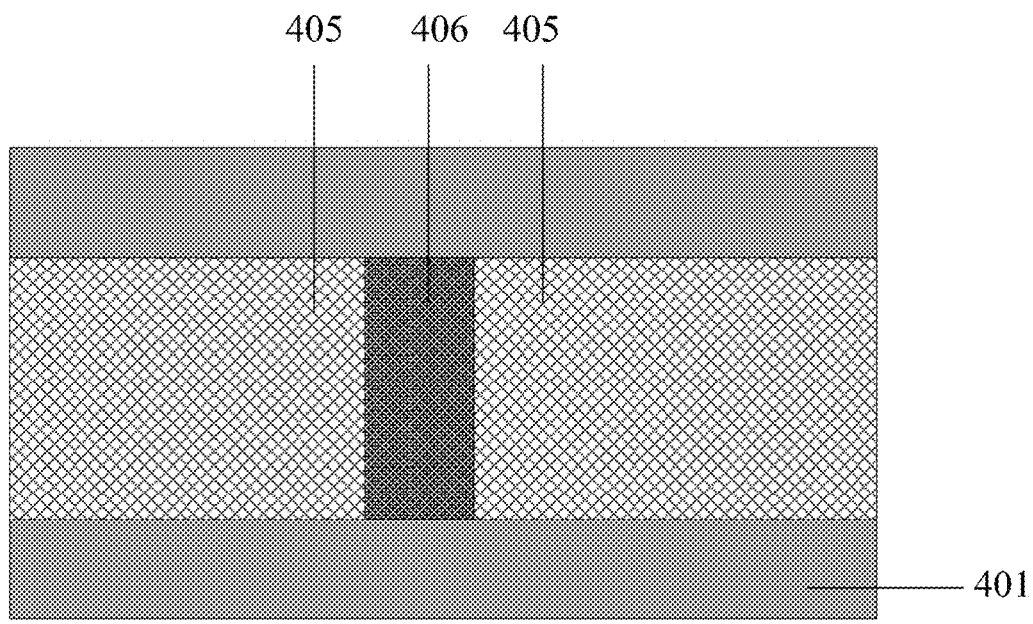
FIG. 19 is a schematic top view of an enhanced heterojunction HHMT based on $CH_3NH_3PbI_3$ material according to an embodiment of the present disclosure.

Referring to FIG. 18 and FIG. 19, FIG. 18 is a schematic cross-sectional view of an enhanced heterojunction HHMT based on a $CH_3NH_3PbI_3$ material according to an embodiment of the present disclosure; and FIG. 19 is a schematic top view of an enhanced heterojunction HHMT based on $CH_3NH_3PbI_3$ material according to an embodiment of the present disclosure. The enhanced heterojunction HHMT may include an $Al_2O_3$ substrate 401, a light reflecting layer 402, a source/drain electrode 403, a first hole transport layer 404, a third light absorbing layer 405, and a gate electrode 406. The $Al_2O_3$ substrate 401, the light reflecting layer 402, the source/drain electrodes 403, the first hole transporting layer 404, the third light absorbing layer 405 and the gate electrode 406 are sequentially distributed from bottom to top to form a multi-layer symmetrical structure.

The reflective layer 402 may be Ag material or a metals such as Al or Cu. The source/drain electrode 403 may be Au material or metals such as Al, Ti, Ni, Ag, or Pt. Among them, Au, Ag, and Pt are chemically stable, and Al, Ti, and Ni are low in cost. The first hole transport layer 404 may be Spiro-OMeTAD material; the third light absorbing layer 405 may be $CH_3NH_3PbI_3$/PCBM material; the gate electrode 406 may be Au material.

Figure 20A:
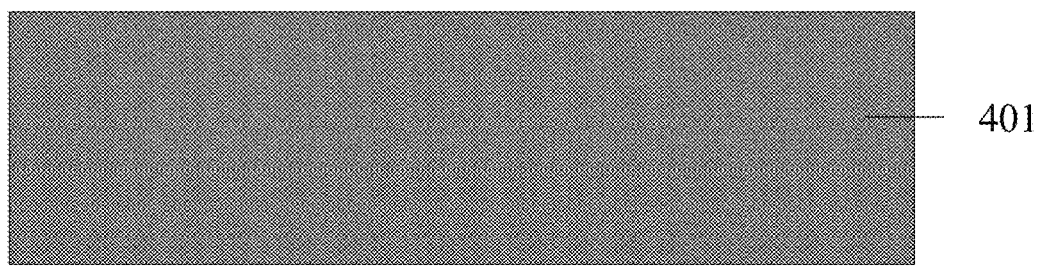
FIG. 20a-20f are schematic diagrams showing processes of a method for manufacturing an enhanced heterojunction HHMT based on $CH_3NH_3PbI_3$ material according to an embodiment of the present disclosure.
Figure 20B:
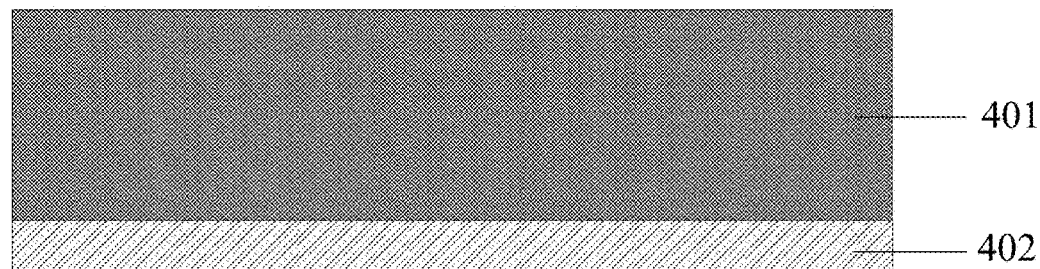
Figure 20C:
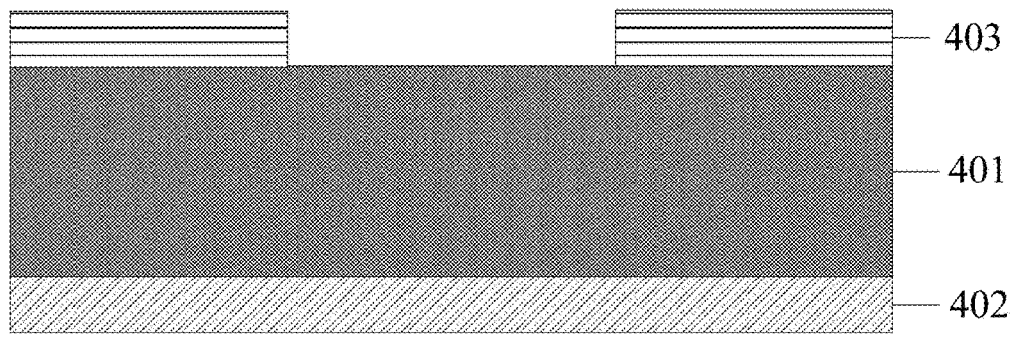
Figure 20D:
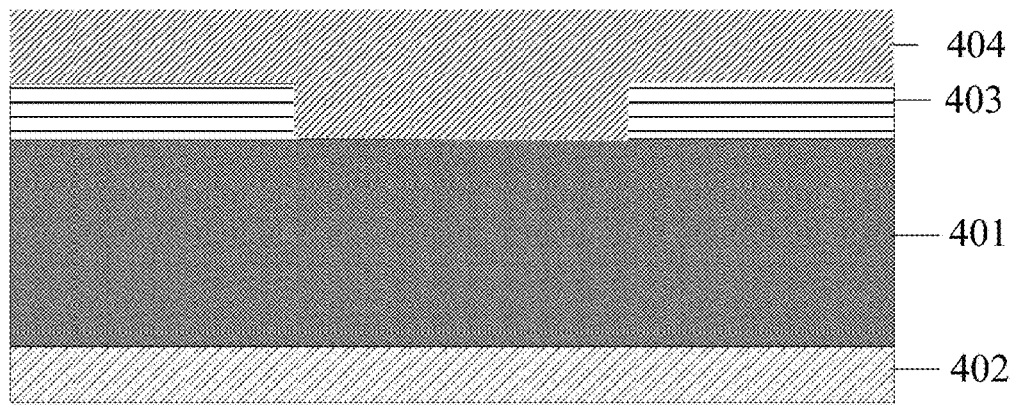
Figure 20E:
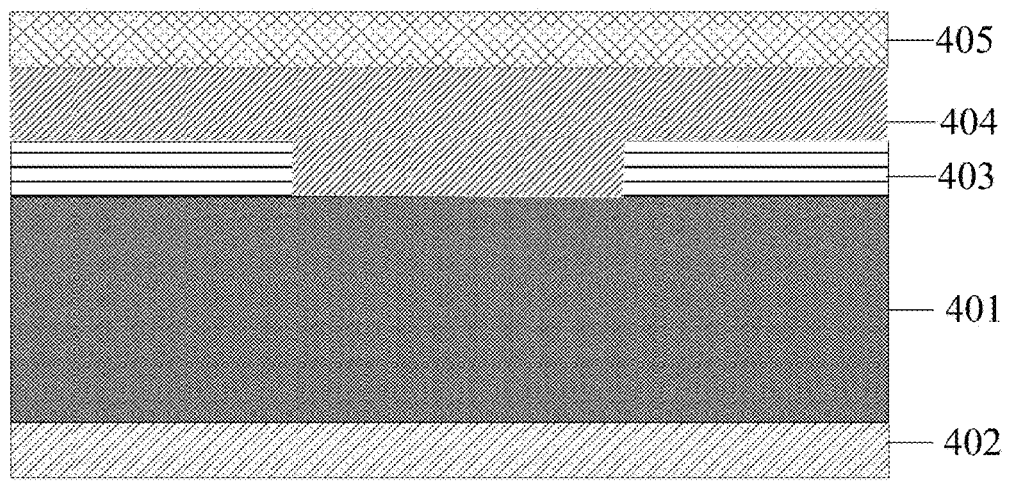
Figure 20F:
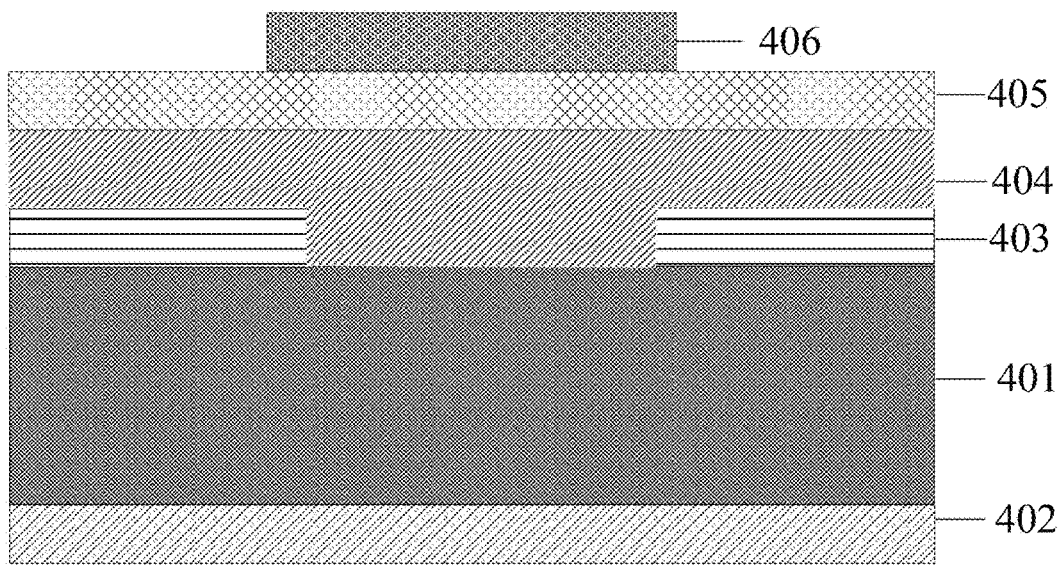
Figure 21:
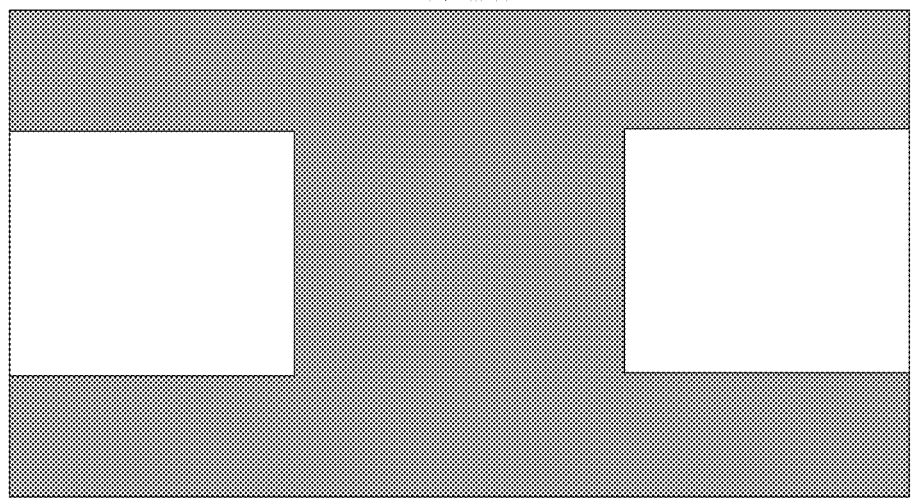
FIG. 21 is a schematic structural diagram of a seventh physical mask according to an embodiment of the present disclosure.
Figure 22:
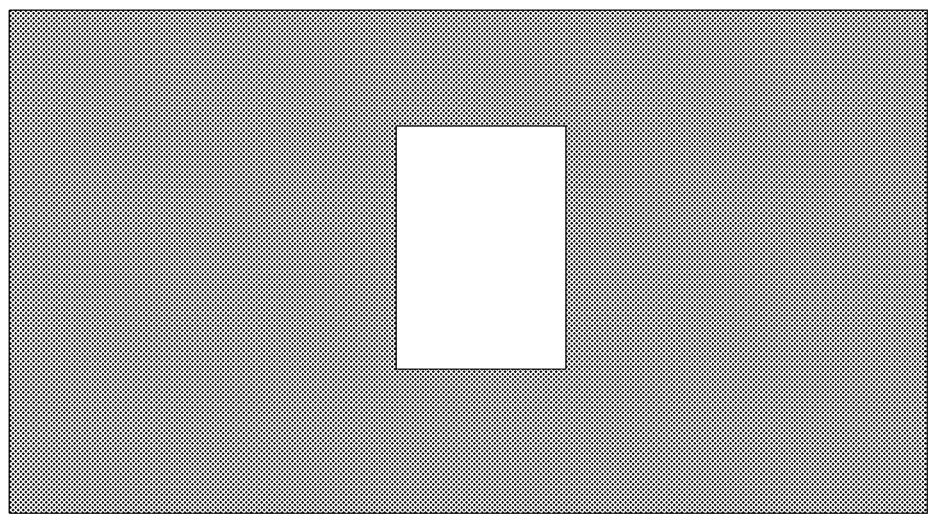
FIG. 22 is a schematic structural diagram of an eighth physical mask according to an embodiment of the present disclosure.

Referring to FIG. 20a-FIG. 20f, FIG. 21, and FIG. 22, FIG. 20a-20f are schematic diagrams showing processes of a method for manufacturing an enhanced heterojunction HHMT based on $CH_3NH_3PbI_3$ material according to an embodiment of the present disclosure; FIG. 21 is a schematic structural diagram of a seventh physical mask according to an embodiment of the present disclosure; FIG. 22 is a schematic structural diagram of an eighth physical mask according to an embodiment of the present disclosure. The preparation method may include the following steps.

Step 401, referring to FIG. 20a, an $Al_2O_3$ substrate 401 with a thickness of 200-600 μm is prepared.

Step 402, referring to FIG. 20b, Ag material is sputter-deposited on the back side of the $Al_2O_3$ substrate 401 to form a light-reflecting layer 402.

Ag material is sputter-deposited on the back side of the $Al_2O_3$ substrate 401 obtained in step 401 by a magnetron sputtering process. Ag with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. An Ag light-reflecting layer is manufactured under the conditions that a vacuum is $6\times10^{-4}$-$1.3\times10^{-3}$ Pa, an Ar flow rate is 20-30 $cm^3/s$, a target base distance is 10 cm, and a working power is 20-100 W. The thickness of the light-reflecting layer is 100-300 nm.

Step 403, referring to FIG. 20c and FIG. 21, using a seventh physical mask, Au material is magnetron-sputtered on the $Al_2O_3$ substrate 401 to form a source/drain electrode 403.

Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A source/drain electrode 403 is manufactured under the conditions that a vacuum is $6\times10^{-4}$-$1.3\times10^{-3}$ Pa, an Ar flow rate is 20-30 $cm^3/s$, a target base distance is 10 cm, and a working power is 20-100 W. The thickness of the source/drain electrode 403 is 100-300 nm.

Step 404, referring to FIG. 20d, a first hole transport layer 404 is spin-coated on the source/drain electrodes prepared in step 403 and the uncovered portion of $Al_2O_3$ substrate 401.

A solution of Spiro-OMeTAD in chlorobenzene at a concentration of 72.3 mg/mL is prepared, and a solution of 520 mg/mL lithium salt in acetonitrile, tetra-tert-butylpyridine and 300 mg/mL cobalt salt in acetonitrile is added, and the volume ratio of the three is 10:17:11. The Spiro-OMeTAD solution is added drop by drop onto the prepared substrate and source/drain electrodes, and then spin-coated to obtain a Spiro-OMeTAD hole transport layer 304 with a thickness of 50-200 nm.

Step 405, referring to FIG. 20e, a third light absorbing layer 405 is manufactured on the first hole transport layer 404 by a single spin coating process.

Using a single spin coating process, 654 mg of $PbI_2$ and 217 mg of $CH_3NH_3I$ is added successively to DMSO:GBL to obtain a mixed solution of $PbI_2$ and $CH_3NH_3I$. The mixed solution of $PbI_2$ and $CH_3NH_3I$ is stirred at 80° C. for two hours to obtain a stirred solution. Then, the stirred solution is stand at 80° C. for 1 hour to obtain a $CH_3NH_3PbI_3$ solution. The mixed solution of $CH_3NH_3PbI_3$: PCBM=100:1 is added drop by drop onto the first hole transport layer 404 obtained in the step 404, and annealed at 100° C. for 20 minutes to form a $CH_3NH_3PbI_3$/PCBM light absorbing layer 405 with a thickness of 200-300 nm.

Step 406, referring to FIG. 20f and FIG. 22, using an eighth physical mask, Au material is magnetron-sputtered on the third light absorbing layer 405 to form a gate electrode 406.

Using a magnetron sputtering process, and Au with a mass percentage of >99.99% is used as a sputtering target, and Ar with a mass percentage of 99.999% is used as a sputtering gas to fill into the sputtering chamber. Before sputtering, the chamber of the magnetron sputtering apparatus is cleaned with high purity Ar for 5 minutes and then evacuated. A gate electrode 406 is manufactured under the conditions that a vacuum is $6\times10^{-4}$-$1.3\times10^{-3}$ Pa, an Ar flow rate is 20-30 $cm^3/s$, a target base distance is 10 cm, and a working power is 20-100 W. The thickness of the gate electrode 406 is 100-300 nm.

In this embodiment, a large amount of electron holes are supplied to the channel by CH3NH3PbI3, and Ag is planted on the lower surface of the substrate to form a reflection-enhanced HHMT, the reflection-enhanced HHMT has high mobility, fast switching speed, enhanced light absorption and light utilization efficiency, increased photogenerated carriers, enhanced transmission characteristics, and large photoelectric conversion efficiency. In addition, by adding a PCBM material to the light absorbing layer to form a heterojunction, the quality of the light absorbing layer film can be improved by filling the holes and vacancies, thereby generating larger crystal grains and less grain boundaries, and absorbing more light to produce photo-generated carriers, thereby enhancing the performance of the device.

The above is only a preferred embodiment of the present disclosure, and is not intended to limit the scope of the present disclosure. The present disclosure has been disclosed in the above preferred embodiments, but is not intended to limit the present disclosure. Those skilled in the art can make some modifications or changes by using the technical content disclosed above, which can be known as equivalent embodiments of the present disclosure and without departing from the scope of the disclosure. Any simple modifications, equivalent changes and modifications made to the above embodiments in accordance with the technical spirit of the present disclosure are still within the scope of the technical solutions of the present disclosure.

INDUSTRIAL APPLICABILITY

In the embodiment of the present disclosure, by using $CH_3NH_3PbI_3$ material in the structure of the HEMT/HHMT, a large amount of electrons/holes are provided to the channel by $CH_3NH_3PbI_3$ as a light absorbing layer. The $CH_3NH_3PbI_3$ material has high mobility, fast switching speed, enhanced light absorption and light utilization, increased photogenerated carriers, enhanced transmission characteristics and high photoelectric conversion efficiency and can greatly improve the performance of HEMT/HHMT.

What is claimed is:

1. A method for manufacturing a HEMT device based on a $CH_3NH_3PbI_3$ material, comprising:
    step 1, selecting an $Al_2O_3$ substrate;
    step 2, preparing a source electrode and a drain electrode on the $Al_2O_3$ substrate;
    step 3, forming a first electron transport layer on a surface of the source electrode, a surface of the drain electrode, and a surface of the $Al_2O_3$ substrate not covered by the source electrode and the drain electrode;
    step 4, applying $CH_3NH_3PbI_3$ material on a surface of the first electron transport layer to form a first light absorbing layer; and
    step 5, forming a gate electrode on a surface of the first light absorbing layer thereby forming the HEMT device.

2. The method according to claim 1, wherein before the step 2, the method further comprises:

step X1, forming an FTO film on a surface of the $Al_2O_3$ substrate;

step X2, applying $CH_3NH_3PbI_3$ material on a surface of the FTO film to form a second light absorbing layer; and step X3, forming a second electron transport layer on a surface of the second light absorbing layer.

3. The method according to claim 2, wherein the step 3 comprises:

under the atmosphere of Ar and $O_2$, depositing $TiO_2$ material on a surface of the source electrode, a surface of the drain electrode, and a surface of the second electron transport layer not covered by the source electrode and the drain electrode, by a magnetron sputtering process, to form the first electron transport layer, wherein $TiO_2$ is used as a sputtering target.

4. The method according to claim 3, wherein the step 4 comprises:

adding $PbI_2$ and $CH_3NH_3I$ successively to DMSO:GBL, stirring, and standing, to form a $CH_3NH_3PbI_3$ solution; and spin-coating the $CH_3NH_3PbI_3$ solution on a surface of the first electron transport layer by a single smear method, and annealing, to form the first light absorbing layer.

5. The method according to claim 1, wherein after step 1, the method further comprises:

sputtering Ag material on the lower surface of the $Al_2O_3$ substrate by a magnetron sputtering process to form a light reflecting layer under the condition that a vacuum is $6\times10^{-4}$-$1.3\times10^{-3}$ Pa and a sputtering power of 20-100 W, wherein Ag is used as a sputtering target, and Ar is used as a sputtering gas to fill into the sputtering chamber.

6. The method according to claim 5, wherein the step 2 comprises:

via a physical mask, sputtering Au material on the upper surface of the sapphire substrate to form the source electrode and the drain electrode by a magnetron sputtering process under the condition that a vacuum is $6\times10^{-4}$-$1.3\times10^{-3}$ Pa and a sputtering power is 20-100 W, wherein Au is used as a sputtering target, and Ar is used as a sputtering gas to fill into the sputtering chamber.

7. The method according to claim 1, wherein step 3 comprises:

sputtering Ag material on the upper surface of the entire substrate, including the source electrode and the drain electrode, to form the first electron transport layer by a magnetron sputtering process under the conditions that a vacuum is $6\times10^{-4}$-$1.3\times10^{-3}$ Pa and a sputtering power is 60-80 W, wherein $TiO_2$ is used as a sputtering target, and Ar and $O_2$ is used as a sputtering gas to fill into the sputtering chamber.

8. The method according to claim 1, wherein step 4 comprises:

spin-coating PCBM material with a mass concentration of 8 mg/ml on a surface of the electron transport layer by a single spin coating process, and annealing, to form an active layer;

spin-coating $CH_3NH_3PbI_3$ material on a surface of the active layer by a single spin coating process; and annealing the $CH_3NH_3PbI_3$ material by an annealing process to form the first light absorbing layer.

9. A method for manufacturing a HHMT device based on a $CH_3NH_3PbI_3$ material, comprising:

step a, selecting an $Al_2O_3$ substrate;

step b, preparing a source electrode and a drain electrode on the $Al_2O_3$ substrate;

step c, forming a first hole transport layer on a surface of the source electrode, a surface of the drain electrode, and a surface of the $Al_2O_3$ substrate not covered by the source electrode and the drain electrode;

step d, applying $CH_3NH_3PbI_3$ material on a surface of the first hole transport layer to form a third light absorbing layer; and step e: forming a gate electrode on a surface of the third light absorbing layer, thereby forming the HEMT device.

10. The method according to claim 9, wherein before the step b, the method further comprises:

step Y1, forming an FTO film on a surface of the substrate;

step Y2, applying $CH_3NH_3PbI_3$ material on a surface of the FTO film to form a fourth light absorbing layer; and step Y3, forming a second hole transport layer on a surface of the fourth light absorbing layer.

11. The method according to claim 10, wherein the step c comprises:

preparing a chlorobenzene solution, and adding a solution of lithium salt in acetonitrile, tetra-tert-butylpyridine and cobalt salt in acetonitrile, stirring at room temperature to form a Spiro-OMeTAD solution; and adding the Spiro-OMeTAD solution drop by drop onto a surface of the source electrode, a surface of the drain electrode, and a surface of the second hole transport layer not covered by the source/drain electrodes, and spin coating to form the first hole transport layer.

12. The method according to claim 11, wherein the step d comprises:

adding $PbI_2$ and $CH_3NH_3I$ successively to DMSO:GBL, stirring, and standing, to form a $CH_3NH_3PbI_3$ solution; and spin-coating the $CH_3NH_3PbI_3$ solution on a surface of the first hole transport layer by a single smear method, and annealing, to form the third light absorbing layer.

13. The method of claim 9, wherein after the step a, the method further comprises:

sputtering Ag material on the lower surface of the $Al_2O_3$ substrate by a magnetron sputtering process to form a light reflecting layer under the condition that a vacuum is $6\times10^{-4}$-$1.3\times10^{-3}$ Pa and a sputtering power of 20-100 W, wherein Ag is used as a sputtering target, and Ar is used as a sputtering gas to fill into the sputtering chamber.

14. The method according to claim 13, wherein step b comprises:

via a physical mask, sputtering Au material on the upper surface of the sapphire substrate to form the source electrode and the drain electrode by a magnetron sputtering process under the condition that a vacuum is $6\times10^{-4}$-$1.3\times10^{-3}$ Pa and a sputtering power is 20-100 W, wherein Au is used as a sputtering target, and Ar is used as a sputtering gas to fill into the sputtering chamber.

15. The method according to claim 9, wherein the step c comprises:

adding a solution of lithium salt in acetonitrile, tetra-tert-butylpyridine and cobalt salt to chlorobenzene in a volume ratio to a solution of Spiro-OMeTAD in chlorobenzene, and stirring, to form Spiro-OMeTAD material; and spin-coating the Spiro-OMeTAD material on the upper surface of the $Al_2O_3$ substrate including the source electrode and the drain electrode to form the first hole transport layer.

16. The method according to claim 9, wherein the step d comprises:
spin-coating a mixed solution of $CH_3NH_3PbI_3$ and PCBM on a surface of the first hole transport layer by a single spin coating process to form $CH_3NH_3PbI_3$/PCBM material; and
annealing the $CH_3NH_3PbI_3$/PCBM material by an annealing process to form the third light absorbing layer.

* * * * *